(12) United States Patent
Chu et al.

(10) Patent No.: US 9,831,315 B2
(45) Date of Patent: *Nov. 28, 2017

(54) SEMICONDUCTOR DEVICES WITH FIELD PLATES

(71) Applicant: Transphorm Inc., Goleta, CA (US)

(72) Inventors: Rongming Chu, Goleta, CA (US); Robert Coffie, Camarillo, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/181,805

(22) Filed: Jun. 14, 2016

(65) Prior Publication Data

US 2016/0293747 A1    Oct. 6, 2016

Related U.S. Application Data

(60) Continuation of application No. 14/660,080, filed on Mar. 17, 2015, now Pat. No. 9,373,699, which is a
(Continued)

(51) Int. Cl.
*H01L 29/40* (2006.01)
*H01L 21/283* (2006.01)
(Continued)

(52) U.S. Cl.
CPC ........ *H01L 29/402* (2013.01); *H01L 21/0217* (2013.01); *H01L 21/02271* (2013.01); *H01L 21/02274* (2013.01); *H01L 21/283* (2013.01); *H01L 21/28587* (2013.01); *H01L 21/30612* (2013.01); *H01L 21/31105* (2013.01);
(Continued)

(58) Field of Classification Search
None
See application file for complete search history.

(56) References Cited

U.S. PATENT DOCUMENTS 4,645,562 A    2/1987  Liao et al.
4,728,826 A    3/1988  Einzinger et al.
(Continued)

FOREIGN PATENT DOCUMENTS

CN    1748320       3/2006
CN    101897029    11/2010
(Continued)

OTHER PUBLICATIONS

Suh, C. S., Y. Dora, N. Fichtenbaum, L. Mccarthy, S. Keller, and U. K. Mishra. "High-Breakdown Enhancement-Mode AlGaN/GaN HEMTs with Integrated Slant Field-Plate." 2006 International Electron Devices Meeting (2006).*
(Continued)

*Primary Examiner* — Joseph Schoenholtz
(74) *Attorney, Agent, or Firm* — Fish & Richardson P.C.

(57) ABSTRACT

A III-N device is described with a III-N material layer, an insulator layer on a surface of the III-N material layer, an etch stop layer on an opposite side of the insulator layer from the III-N material layer, and an electrode defining layer on an opposite side of the etch stop layer from the insulator layer. A recess is formed in the electrode defining layer. An electrode is formed in the recess. The insulator can have a precisely controlled thickness, particularly between the electrode and III-N material layer.

28 Claims, 11 Drawing Sheets

Related U.S. Application Data continuation of application No. 14/178,701, filed on Feb. 12, 2014, now Pat. No. 9,111,961, which is a continuation of application No. 13/748,907, filed on Jan. 24, 2013, now Pat. No. 8,692,294, which is a division of application No. 12/550,140, filed on Aug. 28, 2009, now Pat. No. 8,390,000.

(51) Int. Cl.

| | | |
|---|---|---|
| *H01L 21/02* | (2006.01) | |
| *H01L 29/78* | (2006.01) | |
| *H01L 21/306* | (2006.01) | |
| *H01L 21/311* | (2006.01) | |
| *H01L 29/423* | (2006.01) | |
| *H01L 29/66* | (2006.01) | |
| *H01L 29/778* | (2006.01) | |
| *H01L 29/06* | (2006.01) | |
| *H01L 29/51* | (2006.01) | |
| *H01L 21/765* | (2006.01) | |
| *H01L 29/417* | (2006.01) | |
| *H01L 21/285* | (2006.01) | |
| *H01L 29/20* | (2006.01) | |
| *H01L 29/872* | (2006.01) | |

(52) U.S. Cl.
CPC ........ *H01L 21/765* (2013.01); *H01L 29/0607* (2013.01); *H01L 29/2003* (2013.01); *H01L 29/404* (2013.01); *H01L 29/407* (2013.01); *H01L 29/41766* (2013.01); *H01L 29/4236* (2013.01); *H01L 29/42376* (2013.01); *H01L 29/518* (2013.01); *H01L 29/66212* (2013.01); *H01L 29/66462* (2013.01); *H01L 29/66522* (2013.01); *H01L 29/66666* (2013.01); *H01L 29/778* (2013.01); *H01L 29/7781* (2013.01); *H01L 29/7786* (2013.01); *H01L 29/7787* (2013.01); *H01L 29/78* (2013.01); *H01L 29/872* (2013.01)

(56) References Cited

U.S. PATENT DOCUMENTS

| | | |
|---|---|---|
| 4,821,093 A | 4/1989 | Iafrate et al. |
| 4,914,489 A | 4/1990 | Awano |
| 5,329,147 A | 7/1994 | Vo et al. |
| 5,646,069 A | 7/1997 | Jelloian et al. |
| 5,705,847 A | 1/1998 | Kashiwa et al. |
| 5,714,393 A | 2/1998 | Wild et al. |
| 5,998,810 A | 12/1999 | Hatano et al. |
| 6,008,684 A | 12/1999 | Ker et al. |
| 6,097,046 A | 8/2000 | Plumton |
| 6,316,793 B1 | 11/2001 | Sheppard et al. |
| 6,475,889 B1 | 11/2002 | Ring |
| 6,486,502 B1 | 11/2002 | Sheppard et al. |
| 6,515,303 B2 | 2/2003 | Ring |
| 6,548,333 B2 | 4/2003 | Smith |
| 6,583,454 B2 | 6/2003 | Sheppard et al. |
| 6,586,781 B2 | 7/2003 | Wu et al. |
| 6,649,497 B2 | 11/2003 | Ring |
| 6,727,531 B1 | 4/2004 | Redwing et al. |
| 6,777,278 B2 | 8/2004 | Smith |
| 6,849,882 B2 | 2/2005 | Chavarkar et al. |
| 6,867,078 B1 | 3/2005 | Green et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,045,404 B2 | 5/2006 | Sheppard et al. |
| 7,071,498 B2 | 7/2006 | Johnson et al. |
| 7,084,475 B2 | 8/2006 | Shelton et al. |
| 7,125,786 B2 | 10/2006 | Ring et al. |
| 7,126,212 B2 | 10/2006 | Enquist et al. |
| 7,161,194 B2 | 1/2007 | Parikh et al. |
| 7,170,111 B2 | 1/2007 | Saxler |
| 7,230,284 B2 | 6/2007 | Parikh et al. |
| 7,238,560 B2 | 7/2007 | Sheppard et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,388,236 B2 | 6/2008 | Wu et al. |
| 7,419,892 B2 | 9/2008 | Sheppard et al. |
| 7,432,142 B2 | 10/2008 | Saxler et al. |
| 7,456,443 B2 | 11/2008 | Saxler et al. |
| 7,465,967 B2 | 12/2008 | Smith et al. |
| 7,501,669 B2 | 3/2009 | Parikh et al. |
| 7,544,963 B2 | 6/2009 | Saxler |
| 7,548,112 B2 | 6/2009 | Sheppard |
| 7,550,783 B2 | 6/2009 | Wu et al. |
| 7,550,784 B2 | 6/2009 | Saxler et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,612,390 B2 | 11/2009 | Saxler et al. |
| 7,615,774 B2 | 11/2009 | Saxler |
| 7,638,818 B2 | 12/2009 | Wu et al. |
| 7,678,628 B2 | 3/2010 | Sheppard et al. |
| 7,692,263 B2 | 4/2010 | Wu et al. |
| 7,709,269 B2 | 5/2010 | Smith et al. |
| 7,709,859 B2 | 5/2010 | Smith et al. |
| 7,745,851 B2 | 6/2010 | Harris |
| 7,755,108 B2 | 7/2010 | Kuraguchi |
| 7,777,252 B2 | 8/2010 | Sugimoto et al. |
| 7,795,642 B2 | 9/2010 | Suh et al. |
| 7,812,369 B2 | 10/2010 | Chini et al. |
| 7,855,401 B2 | 12/2010 | Sheppard et al. |
| 7,875,537 B2 | 1/2011 | Suvorov et al. |
| 7,875,914 B2 | 1/2011 | Sheppard |
| 7,884,394 B2 | 2/2011 | Wu et al. |
| 7,884,395 B2 | 2/2011 | Saito |
| 7,892,974 B2 | 2/2011 | Ring et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,948,011 B2 | 5/2011 | Rajan et al. |
| 7,955,918 B2 | 6/2011 | Wu et al. |
| 7,960,756 B2 | 6/2011 | Sheppard et al. |
| 7,985,986 B2 | 7/2011 | Heikman et al. |
| 8,049,252 B2 | 11/2011 | Smith et al. |
| 8,318,562 B2 | 11/2012 | Khan et al. |
| 8,390,000 B2 * | 3/2013 | Chu ................ H01L 21/28587 257/76 |
| 8,519,438 B2 | 8/2013 | Mishra et al. |
| 8,692,294 B2 | 4/2014 | Chu et al. |
| 9,111,961 B2 | 8/2015 | Chu et al. |
| 2001/0032999 A1 | 10/2001 | Yoshida |
| 2001/0040247 A1 | 11/2001 | Ando et al. |
| 2002/0036287 A1 | 3/2002 | Yu et al. |
| 2002/0121648 A1 | 9/2002 | Hsu et al. |
| 2002/0167023 A1 | 11/2002 | Chavarkar et al. |
| 2003/0006437 A1 | 1/2003 | Mizuta et al. |
| 2003/0020092 A1 | 1/2003 | Parikh et al. |
| 2004/0041169 A1 | 3/2004 | Ren et al. |
| 2004/0061129 A1 | 4/2004 | Saxler et al. |
| 2004/0164347 A1 | 8/2004 | Zhao et al. |
| 2005/0001235 A1 | 1/2005 | Murata et al. |
| 2005/0051796 A1 | 3/2005 | Parikh et al. |
| 2005/0077541 A1 | 4/2005 | Shen et al. |
| 2005/0133816 A1 | 6/2005 | Fan et al. |
| 2005/0189561 A1 | 9/2005 | Kinzer et al. |
| 2005/0189562 A1 | 9/2005 | Kinzer et al. |
| 2005/0194612 A1 | 9/2005 | Beach |

(56) References Cited

U.S. PATENT DOCUMENTS

| | | |
|---|---|---|
| 2005/0253168 A1 | 11/2005 | Wu et al. |
| 2005/0274977 A1 | 12/2005 | Saito et al. |
| 2006/0011915 A1 | 1/2006 | Saito et al. |
| 2006/0043499 A1 | 3/2006 | De Cremoux et al. |
| 2006/0060871 A1 | 3/2006 | Beach |
| 2006/0102929 A1 | 5/2006 | Okamoto et al. |
| 2006/0108602 A1 | 5/2006 | Tanimoto |
| 2006/0108605 A1 | 5/2006 | Yanagihara et al. |
| 2006/0121682 A1 | 6/2006 | Saxler |
| 2006/0124962 A1 | 6/2006 | Ueda et al. |
| 2006/0157729 A1 | 7/2006 | Ueno et al. |
| 2006/0186422 A1 | 8/2006 | Gaska et al. |
| 2006/0189109 A1 | 8/2006 | Fitzgerald |
| 2006/0202272 A1 | 9/2006 | Wu et al. |
| 2006/0220063 A1 | 10/2006 | Kurachi et al. |
| 2006/0255364 A1 | 11/2006 | Saxler et al. |
| 2006/0289901 A1 | 12/2006 | Sheppard et al. |
| 2007/0007547 A1 | 1/2007 | Beach |
| 2007/0018187 A1 | 1/2007 | Lee et al. |
| 2007/0018199 A1 | 1/2007 | Sheppard et al. |
| 2007/0018210 A1 | 1/2007 | Sheppard |
| 2007/0045670 A1 | 3/2007 | Kuraguchi |
| 2007/0080672 A1 | 4/2007 | Yang |
| 2007/0128743 A1 | 6/2007 | Huang et al. |
| 2007/0131968 A1 | 6/2007 | Morita et al. |
| 2007/0132037 A1 | 6/2007 | Hoshi et al. |
| 2007/0134834 A1 | 6/2007 | Lee et al. |
| 2007/0145390 A1 | 6/2007 | Kuraguchi |
| 2007/0145417 A1 | 6/2007 | Brar et al. |
| 2007/0158692 A1 | 7/2007 | Nakayama et al. |
| 2007/0164315 A1 | 7/2007 | Smith et al. |
| 2007/0164322 A1 | 7/2007 | Smith et al. |
| 2007/0164326 A1 | 7/2007 | Okamoto et al. |
| 2007/0194354 A1 | 8/2007 | Wu et al. |
| 2007/0205433 A1 | 9/2007 | Parikh et al. |
| 2007/0210329 A1 | 9/2007 | Goto |
| 2007/0215899 A1 | 9/2007 | Herman |
| 2007/0224710 A1 | 9/2007 | Palacios et al. |
| 2007/0228477 A1 | 10/2007 | Suzuki et al. |
| 2007/0241368 A1 | 10/2007 | Mil'shtein et al. |
| 2007/0267655 A1 | 11/2007 | Endoh et al. |
| 2007/0278518 A1 | 12/2007 | Chen et al. |
| 2008/0073670 A1 | 3/2008 | Yang et al. |
| 2008/0093626 A1 | 4/2008 | Kuraguchi |
| 2008/0121876 A1 | 5/2008 | Otsuka et al. |
| 2008/0157121 A1 | 7/2008 | Ohki |
| 2008/0203430 A1 | 8/2008 | Simin et al. |
| 2008/0230784 A1 | 9/2008 | Murphy |
| 2008/0237606 A1 | 10/2008 | Kikkawa et al. |
| 2008/0237640 A1 | 10/2008 | Mishra et al. |
| 2008/0274574 A1 | 11/2008 | Yun |
| 2008/0283844 A1 | 11/2008 | Hoshi et al. |
| 2008/0308813 A1 | 12/2008 | Suh et al. |
| 2009/0032820 A1 | 2/2009 | Chen |
| 2009/0032879 A1 | 2/2009 | Kuraguchi |
| 2009/0045438 A1 | 2/2009 | Inoue et al. |
| 2009/0050936 A1 | 2/2009 | Oka |
| 2009/0065810 A1 | 3/2009 | Honea et al. |
| 2009/0072240 A1 | 3/2009 | Suh et al. |
| 2009/0072269 A1 | 3/2009 | Suh et al. |
| 2009/0072272 A1 | 3/2009 | Suh et al. |
| 2009/0075455 A1 | 3/2009 | Mishra |
| 2009/0085065 A1 | 4/2009 | Mishra et al. |
| 2009/0114948 A1 | 5/2009 | Ishida |
| 2009/0121775 A1 | 5/2009 | Ueda et al. |
| 2009/0146185 A1 | 6/2009 | Suh et al. |
| 2009/0146224 A1 | 6/2009 | Heying et al. |
| 2009/0201072 A1 | 8/2009 | Honea et al. |
| 2009/0218598 A1 | 9/2009 | Goto |
| 2010/0067275 A1 | 3/2010 | Wang et al. |
| 2010/0171150 A1 | 7/2010 | Smith et al. |
| 2011/0006346 A1 | 1/2011 | Ando et al. |
| 2011/0012110 A1 | 1/2011 | Sazawa et al. |
| 2013/0200435 A1 | 8/2013 | Chu et al. |
| 2014/0162421 A1 | 6/2014 | Chu et al. |

FOREIGN PATENT DOCUMENTS

| | | |
|---|---|---|
| CN | 102017160 | 4/2011 |
| EP | 1 843 390 | 10/2007 |
| EP | 1 998 376 | 12/2008 |
| EP | 2 188 842 | 5/2010 |
| JP | 09-306926 | 11/1997 |
| JP | 2000-058871 | 2/2000 |
| JP | 2003-229566 | 8/2003 |
| JP | 2003-244943 | 8/2003 |
| JP | 2004-253620 | 9/2004 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-505501 | 3/2007 |
| JP | 2007-215331 | 8/2007 |
| JP | 2008-091699 | 4/2008 |
| JP | 2008-199771 | 8/2008 |
| JP | 2008-243848 | 10/2008 |
| JP | 2009-503815 | 1/2009 |
| JP | 2009-059946 | 3/2009 |
| JP | 2009-524242 | 6/2009 |
| JP | 2010-539712 | 12/2010 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |

OTHER PUBLICATIONS

Arulkumaran et al., "Enhancement of breakdown voltage by AlN buffer layer thickness in AlGaN/GaN high-electron-mobility transistors on 4 in. diameter silicon," Applied Physics Letters, 2005, 86:123503-1-3.

Arulkumaran et al., "Surface passivation effects on AlGaN/GaN high-electron-mobility transistors with $SiO_2$, $Si_3N_4$, and silicon oxynitride," Applied Physics Letters, 2004, 84(4):613-615.

Ando et al., "10-W/mm AlGaN—GaN HFET with a field modulating plate," IEEE Electron Device Letters, 2003, 24(5):289-291.

Authorized officer Chung Keun Lee, International Search Report and Written Opinion in PCT/US2008/076079, dated Mar. 20, 2009, 11 pages.

Authorized officer Nora Lindner, International Preliminary Report on Patentability in PCT/US2008/076079, dated Apr. 1, 2010, 6 pages.

Authorized officer Keon Hyeong Kim, International Search Report and Written Opinion in PCT/US2008/076160, dated Mar. 18, 2009, 11 pages.

Authorized officer Simin Baharlou, International Preliminary Report on Patentability in PCT/US2008/076160, dated Mar. 25, 2010, 6 pages.

Authorized officer Chung Keun Lee, International Search Report and Written Opinion in PCT/US2008/076199, dated Mar. 24, 2009, 11 pages.

Authorized officer Dorothée Miilhausen, International Preliminary Report on Patentability in PCT/US2008/076199, dated Apr. 1, 2010, 6 pages.

(56) References Cited

OTHER PUBLICATIONS

Authorized officer Keon Hyeong Kim, International Search Report and Written Opinion in PCT/US2008/085031, dated Jun. 24, 2009, 11 pages.
Authorized officer Yolaine Cussac, International Preliminary Report on Patentability in PCT/US2008/085031, dated Jun. 24, 2010, 6 pages.
Authorized officer Tae Hoon Kim, International Search Report and Written Opinion in PCT/US2009/041304, dated Dec. 18, 2009, 13 pages.
Authorized officer Dorothee Miilhausen, International Preliminary Report on Patentability in PCT/US2009/041304, dated Nov. 4, 2010, 8 pages.
Authorized officer Sung Hee Kim, International Search Report and Written Opinion in PCT/US2009/057554, dated May 10, 2010, 13 pages.
Authorized officer Gijsbertus Beijer, International Preliminary Report on Patentability in PCT/US2009/057554, dated Apr. 7, 2011, 7 pages.
Authorized officer Cheon Whan Cho, International Search Report and Written Opinion in PCT/US2009/066647, dated Jul. 1, 2010, 16 pages.
Authorized officer Athina Nikitas-Etienne, International Preliminary Report on Patentability in PCT/US2009/066647, dated Jun. 23, 2011, 12 pages.
Authorized officer Chung Keun Lee, International Search Report and Written Opinion in PCT/US2009/076030, dated Mar. 23, 2009, 10 pages.
Authorized officer Yolaine Cussac, International Preliminary Report on Patentability in PCT/US2009/076030, dated Mar. 25, 2010, 5 pages.
Authorized officer Sung Chan Chung, International Search Report and Written Opinion in PCT/US2010/021824, dated Aug. 23, 2010, 9 pages.
Authorized officer Beate Giffo-Schmitt, International Preliminary Report on Patentability in PCT/US2010/021824, dated Aug. 18, 2011, 7 pages.
Authorized officer Sang Ho Lee, International Search Report and Written Opinion in PCT/US2010/034579, dated Dec. 24, 2010, 9 pages.
Authorized officer Nora Lindner, International Preliminary Report on Patentability in PCT/US2010/034579, dated Nov. 24, 2011, 7 pages.
Authorized officer Choi Jeongmin, International Search Report and Written Opinion in PCT/US2010/046193 dated Apr. 26, 2011, 13 pages.
Authorized officer Philippe Bécamel, International Preliminary Report on Patentability in PCT/US2010/046193, dated Mar. 8, 2012, 10 pages.
Authorized officer Sang Ho Lee, International Search Report and Written Opinion in PCT/US2010/059486, dated Jul. 26, 2011, 9 pages.
Authorized officer Nora Lindner, International Preliminary Report on Patentability in PCT/US2010/059486, dated Jun. 21, 2012, 6 pages.
Supplementary European Search Report in EP 10 815 813.0, dated Mar. 12, 2013, 9 pages.
Communication pursuant to Article 94(3) EPC in EP 10 815 813.0, dated Nov. 5, 2013, 8 pages.
Final Rejection in JP 2012-526862, dated Mar. 10, 2015, 4 pages.
Notice of Reasons for Rejection in JP Application No. 2012-526862, dated Jul. 29, 2014, 6 pages.
Communication Pursuant to Article 94(3) EPC for European Patent Application No. 10 815 813.0, received on Apr. 9, 2015. 6 pages.
Barnett and Shinn, "Plastic and elastic properties of compositionally modulated thin films," Annu. Rev. Mater. Sci., 1994, 24:481-511.
Boutros et al., "Normally-off 5A/1100V GaN-on-Silicon Device for High Voltage Applications," Electron Devices Meeting (IEDM), Dec. 2009 IEEE International, pp. 7.5.1-7.5.3.
Chen et al., "High-performance AlGaN/GaN lateral field-effect rectifiers compatible with high electron mobility transistors," Jun. 25, 2008, Applied Physics Letters, 92, 253501-1-3.
Chen, et al., "High-performance AlGaN/GaN HEMT-compatible Lateral Field-effect Rectifiers," 2008, Device Research Conference, pp. 287-288.
Cheng et al., "Flat GaN epitaxial layers grown on Si(111) by metalorganic vapor phase epitaxy using step-graded AlGaN intermediate layers," Journal of Electronic Materials, 2006, 35(4):592-598.
Coffie, "Characterizing and suppressing DC-to-RF dispersion in AlGaN/GaN high electron mobility transistors," 2003, PhD Thesis, University of California, Santa Barbara, 169 pages.
Coffie et al., "Unpassivated p-GaN/AlGaN/GaN HEMTs with 7.1 W/mm at 10 GhZ," Electronic Letters, 39(19):1419-1420, 2003.
Chu et al., "1200-V normally off GaN-on-Si field-effect transistors with low dynamic ON-resistance," IEEE Electron Device Letters, 32(5):632-634, 2011.
Dora, "Understanding material and process limits for high breakdown voltage AlGaN/GaN HEMTs," Diss., University of California, Santa Barbara, 2006.
Dora et al., "ZrO$_2$ gate dielectrics produced by ultraviolet ozone oxidation for GaN and AlGaN/GaN transistors," Mar./Apr. 2006, J. Vac. Sci. Technol. B, 24(2)575-581.
Dora et al., "High breakdown voltage achieved on AlGaN/GaN HEMTs with integrated slant field plates," Sep. 9, 2006, IEEE Electron Device Letters, 27(9):713-715.
Fanciulli et al., "Structural and electrical properties of HfO$_2$ films grown by atomic layer deposition on Si, Ge, GaAs and GaN," 2004, Mat. Res. Soc. Symp. Proc., vol. 786, 6 pp.
Green et al., "The effect of surface passivation on the microwave characteristics of undoped AlGaN/GaN HEMT's," IEEE Electron Device Letters, Jun. 2000, 21(6):268-270.
Gu et al., "AlGaN/GaN MOS transistors using crystalline ZrO$_2$ as gate dielectric," 2007, Proceedings of SPIE, vol. 6473, 64730S-1-8.
Higashiwaki et al., "AlGaN/GaN heterostructure field effect transistors on 4H-Sic substrates with current-gain cutoff frequency of 190 GHz," Applied Physics Express, 2008, 021103-1-3.
Hinoki et al. "Correlation between the leakage current and the thickness of GaN-layer of AlGaN/GaN-HFET," Phys. Stat. Sol. (c) 4.7 (2007): 2728-2731.
Huang et al. "Comparison of MOS capacitors on N- and P-type GaN," Journal of Electronic Materials, 2006, 35(4):726-732.
Hwang et al., "Effects of a molecular beam epitaxy grown AlN passivation layer on AlGaN/GaN heterojunction field effect transistors," Solid-State Electronics, 2004, 48:363-366.
Ikeda et al., "Normally-off operation GaN HFET using a thin AlGaN layer for low loss switching devices," Mater. Res. Soc. Symp. Proc., 2005, 831:E6.5.1-E6.5.6.
Im et al., "Normally off GaN MOSFET based on AlGaN/GaN heterostructure with extremely high 2DEG density grown on silicon substrate," IEEE Electron Device Letters, 31(3):192-194, 2010.
Karmalkar and Mishra, "Enhancement of breakdown voltage in AlGaN/GaN high electron IEEE Transactions on Electron Devices, mobility transistors using a field plate," 48(8):1515-1521, 2001.
Karmalkar and Mishra, "Very high voltage AlGaN/GaN high electron mobility transistors using a field plate deposited on a stepped insulator," Solid-State Electronics, 2001, 45:1645-1652.
Keller et al. (2002), "GaN—GaN junctions with ultrathin AlN interlayers: expanding heterojunction design," Applied Physics Letters, 80(23):4387-4389.
Keller et al., "Method for heteroepitaxial growth of high quality N-Face GaN, InN and AlN and their alloys by metal organic chemical vapor deposition," U.S. Appl. No. 60/866,035, filed Nov. 15, 2006, 31 pages.
Khan et al., "AlGaN/GaN metal oxide semiconductor heterostructure field effect transistor," IEEE Electron Device Letters, 2000, 21(2):63-65.
Kim, "Process development and device characteristics of AlGan/GaN HEMTs for high frequency applications," Diss., University of Illinois at Urbana-Champaign, 2008, 120 pages.

(56) References Cited

OTHER PUBLICATIONS

Kumar et al., "High transconductance enhancement-mode AlGaN/GaN HEMTs on SiC substrate," Electronics Letters, Nov. 27, 2003, 39(24):1758-1760.
Kuraguchi et al. (2007), "Normally-off GaN-MISFET with well-controlled threshold voltage," Phys. Stats. Sol., 204(6):2010-2013.
Lanford et al., "Recessed-gate enhancement-mode GaN HEMT with high threshold voltage," Mar. 31, 2005, Electronics Letters, vol. 41, No. 7, 2 pages, Online No. 20050161.
Lee et al., "Self-aligned process for emitter- and base-regrowth GaN HBTs and BJTs," Solid-State Electronics, 45:243-247, 2001.
Marchand et al., "Metalorganic chemical vapor deposition of GaN on Si(111): stress control and application to field-effect transistors," Journal of Applied Physics, 2001, 89(12):7846-7851.
Meneghesso et al., "Surface-related drain current dispersion effects in AlGaN—GaN HEMTs," IEEE Transactions on Electronic Devices, vol. 51, No. 10, Oct. 2004.
Mishra et al., "AlGaN/GaN HEMTs—an overview of device operation and applications," Proceedings of the IEEE 2002, 90(6):1022-1031.
Mishra et al., "Growing N-polar III-nitride structures," U.S. Appl. No. 60/972,467, filed Sep. 14, 2007, 7 pp.
Mishra et al., "N-face high electron mobility transistors with low buffer leakage and low parasitic resistance," U.S. Appl. No. 60/908,914, filed Mar. 29, 2007, 21 pages.
Mishra et al., "Polarization-induced barriers for n-face nitride-based electronics," U.S. Appl. No. 60/940,052, filed May 24, 2007, 29 pages.
Nanjo et al., "Remarkable breakdown voltage enhancement in AlGaN channel high electron mobility transistors," Applied Physics Letters, 2008, 92:263502-1-3.
Oka and Nozawa, "AlGaN/GaN recessed MIS-Gate HFET with high threshold-voltage normally-off operation for power electronics applications," IEEE Electron Device Letters, 2008, 29(7):668-670.
Palacios et al., "AlGaN/GaN HEMTs with an InGaN-based back-barrier," Device Research Conference Digest, 2005 (DRC '05) 63rd, Jun. 2005, pp. 181-182.
Palacios et al., "AlGaN/GaN High Electron Mobility Transistors with InGaN Back-Barriers," IEEE Electron Device Letters, Jan. 2006, 27(1):13-15.
Palacios et al., "Fluorine treatment to shape the electric field in electron devices, passivate dislocations and point defects, and enhance the luminescence efficiency of optical devices," U.S. Appl. No. 60/736,628, filed Nov. 15, 2005, 21 pages.
Palacios et al. (2006), "Nitride-based high electron mobility transistors with a GaN spacer," Applied Physics Letters, 89:073508-1-3.
Pei et al., "Effect of dielectric thickness on Power performance of AlGaN/GaN HEMTs," IEEE Electron Device Letters, 30(4):313-315, 2009.
"Planar, Low Switching Loss, Gallium Nitride Devices for Power Conversion Applications," SBIR N121-090 (Navy), n.d.
Rajan et al., "Advanced transistor structures based on N-face GaN," 32M International Symposium on Compound Semiconductors (ISCS), Sep. 18-22, 2005, Europa-Park Rust, Germany, 2 pages.
Rajan et al., "Method for Heteroepitaxial growth of high quality N-Face GaN, InN and AlN and their alloys by metal organic chemical vapor deposition," U.S. Appl. No. 60/866,035, filed Nov. 15, 2006, 31 pages.
Reiher et al. (2003), "Efficient stress relief in GaN heteroepitaxy on SiC (111) using low-temperature AlN interlayers," Journal of Crystal Growth, 248:563-567.
Saito et al. "Recessed-gate structure approach toward normally off high voltage AlGaN/GaN HEMT for power electronics applications," IEEE Transactions on Electron Devices, 53(2):356-362, 2006.
Shelton et al., "Selective area growth and characterization of AlGaN/GaN heterojunction bipolar transistors by metalorganic chemical vapor deposition," IEEE Transactions on Electron Devices, 2001, 48(3):490-494.
Shen et al. "High-power polarization-engineered GaN/AlGaNGaN HEMTs without surface passivation." IEEE Electron Device Letters, 2004 25(1):7-9.
Shen, "Advanced polarization-based design of AlGaN/GaN HEMTs," Jun. 2004, PhD Thesis, University of California, Santa Barbara, 191 pp.
SIPO First Office Action for Application No. 200880120050.6, Aug. 2, 2011, 8 pages.
Suh et al., "High breakdown enhancement mode GaN-based HEMTs with integrated slant field plate," U.S. Appl. No. 60/822,886, filed Aug. 18, 2006, 16 pp.
Suh et al., "III-nitride devices with recessed gates," U.S. Appl. No. 60/972,481, filed Sep. 14, 2007, 18 pp.
Suh et al., "High-breakdown enhancement mode AlGaN/GaN HEMTs with integrated slant field-plate," Electron Devices Meeting, 2006, IEDM '06 International, 3 pages.
Sugiura et al., "Enhancement-mode n-channel GaN MOSFETs fabricated on p-GaN using $HfO_2$ as gate oxide," Aug. 16, 2007, Electronics Letters, vol. 43, No. 17, 2 pp.
Tipirneni et al., "Silicon dioxide-encapsulated high-voltage AlGaN/GaN HFETs for power-switching applications," IEEE Electron Device Letters, 28(9):784-786, 2007.
Vetury et al., "Direct measurement of gate depletion in high breakdown (405V) Al/GaN/GaN heterostructure field effect transistors," Electron Device Meeting, 1998 (IEDM 98), Technical Digest, pp. 55-58.
Wang et al., "Comparison of the effect of gate dielectric layer on 2DEG carrier concentration in strained AlGaN/GaN heterostructure," 2005, Mater. Res. Soc. Symp. Proc., vol. 831, 6 pp.
Wang et al., "Enhancement-mode $Si_3N_4$/AlGaN/GaN MISHFETs," IEEE Electron Device Letters, 2006, 27(10):793-795.
Wu, et al., "A 97.8% efficient GaN HEMT boost converter with 300-W output power at 1 MHz," IEEE Electron Device Letters, 2008, 29(8):824-826.
Wu, "AlGaN/GaN microwave power high-mobility-transistors," Diss., University of California, Santa Barbara, 1997.
Yoshida, "AlGan/GaN power FET," Furukawa Review, 21:7-11, 2002.
Zhang, "High voltage GaN HEMTs with low on-resistance for switching applications," Diss., University of California, Santa Barbara, 2002.
First Office Action in Chinese Application No. 201410772862.6, dated Feb. 8, 2017, 27 pages.
Notice of Reasons for Rejection in Japanese Application No. 2016-051755, dated Jan. 31, 2017, 5 pages.
Notice of Reasons for Rejection in Japanese Application No. 2016-051755, dated Jun. 6, 2017, 6 pages.

* cited by examiner

SEMICONDUCTOR DEVICES WITH FIELD PLATES

CROSS-REFERENCE TO RELATED APPLICATIONS

This application is a continuation of U.S. application Ser. No. 14/660,080, filed on Mar. 17, 2015, which is a continuation of U.S. application Ser. No. 14/178,701, filed Feb. 12, 2014 (now U.S. Pat. No. 9,111,961), which is a continuation of U.S. application Ser. No. 13/748,907, filed Jan. 24, 2013 (now U.S. Pat. No. 8,692,294), which is a divisional of U.S. application Ser. No. 12/550,140, filed Aug. 28, 2009 (now U.S. Pat. No. 8,390,000). The disclosures of the prior applications are considered part of and are incorporated by reference in the disclosure of this application.

TECHNICAL FIELD

This invention relates to semiconductor electronic devices, specifically devices with field plates.

BACKGROUND

To date, modern power semiconductor devices, including devices such as power MOSFETs and Insulated Gate Bipolar Transistors (IGBT), have been typically fabricated with silicon (Si) semiconductor materials. More recently, silicon carbide (SiC) power devices have been researched due to their superior properties. III-Nitride (III-N) semiconductor devices are now emerging as an attractive candidate to carry large currents and support high voltages, and provide very low on resistance, high voltage device operation, and fast switching times. A typical III-N high electron mobility transistor (HEMT), shown in FIG. 1, comprises a substrate 10, a channel layer 11, such as a layer of GaN, atop the substrate, and a barrier layer 12, such as a layer of $Al_xGa_{1-x}N$, atop the channel layer. A two-dimensional electron gas (2DEG) channel 19 is induced in the channel layer 11 near the interface between the channel layer 11 and the barrier layer 12. Source and drain electrodes 14 and 15, respectively, form ohmic contacts to the 2DEG channel. Gate 16 modulates the portion of the 2DEG in the gate region, i.e., directly beneath gate 16.

Field plates are commonly used in III-N devices to shape the electric field in the high-field region of the device in such a way that reduces the peak electric field and increases the device breakdown voltage, thereby allowing for higher voltage operation. An example of a field plated III-N HEMT is shown in FIG. 2. In addition to the layers included in the device of FIG. 1, the device in FIG. 2 includes a field plate 18 which is connected to gate 16, and an insulator layer 13, such as a layer of SiN, is between the field plate and the barrier layer 12. Field plate 18 can include or be formed of the same material as gate 16. Insulator layer 13 can act as a surface passivation layer, preventing or suppressing voltage fluctuations at the surface of the III-N material adjacent to insulator layer 13.

Slant field plates have been shown to be particularly effective in reducing the peak electric field and increasing the breakdown voltage in III-N devices. A III-N device similar to that of FIG. 2, but with a slant field plate 28 is shown in FIG. 3. In this device, gate 16 and slant field plate 28 are formed of a single electrode 29. Insulator layer 23, which can be of SiN, contains a recess which defines at least in part the shape of electrode 29. Herein, insulator layer 23 will be referred to as "electrode defining layer 23". Electrode defining layer 23 can also act as a surface passivation layer, preventing or suppressing voltage fluctuations at the surface of the III-N material adjacent to electrode defining layer 23. The gate 16 and slant field plate 28 in this device can be formed by first depositing electrode defining layer 23 over the entire surface of barrier layer 12, then etching a recess through the electrode defining layer 23 in the region containing gate 16, and finally depositing electrode 29 at least in the recess.

In many applications in which III-N devices are used, for example high power and high voltage applications, it can be advantageous to include a gate insulator between gate 16 and the underlying III-N layers in order to prevent gate leakage. A device with a slant field plate and a gate insulator is shown in FIG. 4. This device can be achieved by a slight modification to the process for the device in FIG. 3. For the device in FIG. 4, the recess in electrode defining layer 23 is only etched part way through the layer (rather than all the way through the layer), after which electrode 29 is deposited. In this device, the portion of electrode defining layer 23 which is between gate 16 and the underlying III-N layers serves as a gate insulator.

SUMMARY

In one aspect, a III-N device is described that includes a III-N material layer, an insulator layer on a surface of the III-N material layer, an etch stop layer on an opposite side of the insulator layer from the III-N material layer, an electrode defining layer on an opposite side of the etch stop layer from the etch stop layer from the insulator layer and an electrode. A recess is formed in the electrode defining layer and the electrode is formed in the recess.

For all devices described herein, one or more of the following may be applicable. The electrode can include a field plate. The field plate can be a slant field plate. A portion of the recess in the electrode defining layer can have angled walls with at least a portion that is at a non-perpendicular angle to a main surface of the etch stop layer, the angled walls defining the slant field plate. The non-perpendicular angle can be between about 5 degrees and 85 degrees. The insulator layer can be a passivation layer. The insulator layer can be formed of an oxide or nitride. The insulator layer can be about 2-50 nanometers thick. The insulator layer can have a capacitance per unit area of about 0.8-40 millifarads/$meter^2$. The electrode defining layer can be formed of an oxide or nitride. The electrode defining layer can be at least about 100 nanometers thick. A combined thickness of the insulator layer and the electrode defining layer can be sufficient to substantially suppress dispersion. The etch stop layer can be between about 1 and 15 nanometers thick. The etch stop layer can be formed of aluminum nitride. The electrode defining layer and etch stop layer can be formed of different materials. The etch stop layer and insulator layer can be formed of different materials. The recess can be formed in the etch stop layer.

In some embodiments, the III-N device is a diode. The diode can include one or more of the following features. The recess can be formed in the insulator layer. A first portion of the III-N material layer can have a first composition and a second portion of the III-N material layer can have a second composition, wherein a difference between the first composition and the second composition forms a 2DEG channel in the III-N material layer. The diode can include a cathode, wherein a portion of the electrode is an anode, the anode forms a substantially Schottky contact to the III-N material layer, and the cathode is in electrical contact with the 2DEG channel. The recess can extend into the III-N material layer and the electrode is in a portion of the recess in the III-N material layer. The recess can extend through the 2DEG channel. A threshold of a first region of the device can be greater than about −15V, wherein the first region comprises a portion of the device which is between an anode region and the cathode and is adjacent to the anode region. A thickness of the insulator layer can be sufficient to prevent leakage currents greater than about 10 microamperes/millimeter from passing through the insulator layer during device operation. The electrode can be an anode electrode and the device can further comprise a cathode.

In some embodiments, the device is a HEMT. The HEMT may include one or more of the following features. A first portion of the III-N material layer can have a first composition and a second portion of the III-N material layer can have a second composition, wherein a difference between the first composition and the second composition forms a 2DEG channel in the III-N material layer. The device can include source and a drain, wherein a portion of the electrode is a gate, and the source and the drain are in electrical contact with the 2DEG channel. A device threshold voltage can be greater than about −30V. A thickness of the insulator layer can be chosen such that the device threshold voltage is greater than about −30V. A thickness of the insulator layer can be sufficient to prevent leakage currents greater than about 100 microamperes from passing through the insulator layer during device operation. The electrode can be a gate electrode and the device can further comprise a source and a drain. The device can be a FET, where a dynamic on-resistance as measured when the device is switched from the OFF state, with a source-drain bias of about 800 V or less, to the ON state, is equal to or less than 1.4 times a DC on-resistance.

Any one of the devices described herein may include multiple field plates. Devices with multiple field plates can include the following features. The electrode defining layer and the etch stop layer can be a first electrode defining layer and a first etch stop layer, the device can further comprise a stack on an opposite side of the first electrode defining layer from the first etch stop layer, wherein the stack comprises a second etch stop layer and a second electrode defining layer. A recess can be formed in the stack, and a portion of the electrode overlies the stack. A second insulator layer can be between the first electrode defining layer and the second etch stop layer. The device can include a second electrode, wherein a second recess is formed in the second electrode defining layer and in the second etch stop layer, and the second electrode can be formed in the second recess. The second electrode can be electrically connected to the first electrode. The device can include a plurality of stacks, wherein a recess is formed in each stack, and an electrode is formed in each recess.

In another aspect a method of forming a III-N device is described. The method includes applying an insulator layer on the surface of a III-N material layer. After applying the insulator layer, an etch stop layer is applied on the insulator layer. After applying the etch stop layer, the electrode defining layer is applied on the etch stop layer. The electrode defining layer is etched to form the recess, wherein the recess is defined at least in part by a wall that is not perpendicular to a surface of the etch stop layer. The etching step uses an etchant that is selective to etching the electrode defining layer at a faster rate than the etch stop layer. A conductive material is deposited in the recess and on an exposed portion of the electrode defining layer.

One or more embodiments of the method can include one or more of the following features. The method can include etching the etch stop layer to extend the recess in the electrode defining layer to the insulator layer. Etching the etch stop layer can include wet etching. Etching the electrode defining layer can include dry etching or a Fluorine-based dry etch. An etch process used to etch the etch stop layer may not substantially etch the electrode defining layer or the insulator layer. The etch process can etch the etch stop layer with a selectivity of about 10:1 or higher. Etching the electrode defining layer can result in the electrode defining layer having angled walls with at least a portion that is at a non-perpendicular angle to a main surface of the etch stop layer. The non-perpendicular angle can be between about 5 degrees and 85 degrees. An etch process used to etch the electrode defining layer may not substantially etch the etch stop layer. The etch process can etch the electrode defining layer with a selectivity of about 10:1 or higher.

Gate insulators typically need to be made thin to maintain an adequate coupling between the gate and 2DEG channel, and typically the thickness of the gate insulator must be controlled to a high degree of precision in order to ensure reproducibility of the device threshold voltage and other device parameters. The techniques described here may result in sufficiently precise control of the gate insulator thickness, especially when a very thin gate insulator is required, and thus reproducible manufacturing using this process may be possible.

DESCRIPTION OF DRAWINGS

Like reference symbols in the various drawings indicate like elements.

DETAILED DESCRIPTION

Semiconductor devices, such as HEMTs and diodes, are described which can be manufactured reproducibly. The devices all include slant field plates, and some also include a gate insulator between a gate and underlying semiconductor layers. The use of slant field plates can result in devices with superior properties for high-voltage switching applications, such as high breakdown voltage and minimal dispersion at high voltage operation, while the gate insulator, when included in transistor structures, can result in reduced gate leakage. Furthermore, the manufacturing process for the devices can be reproducible using conventional semiconductor device fabrication processes. The semiconductor devices can be III-Nitride or III-N semiconductor devices, and so devices described herein include III-N semiconductor layers. Methods of forming the devices are also described.

Figure 1:
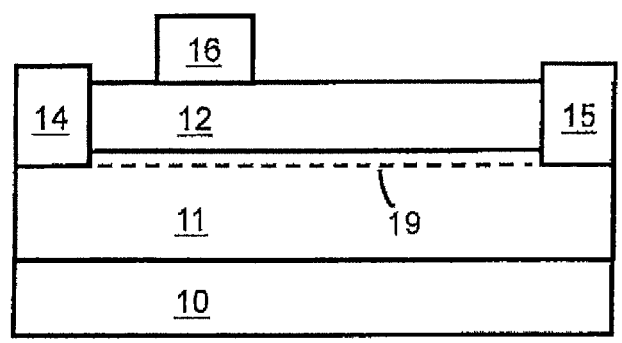
FIGS. 1-4 are schematic cross-sectional views of III-N HEMT devices of the prior art.
Figure 2:
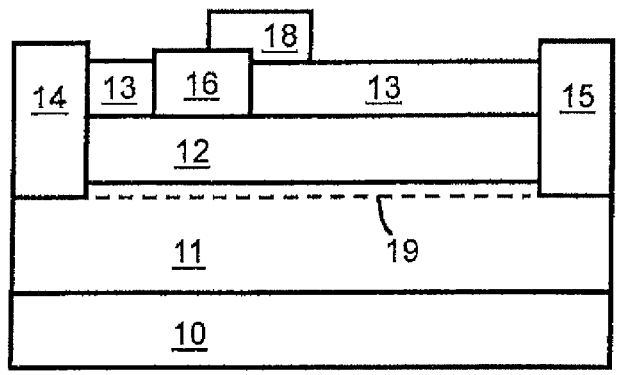
Figure 3:
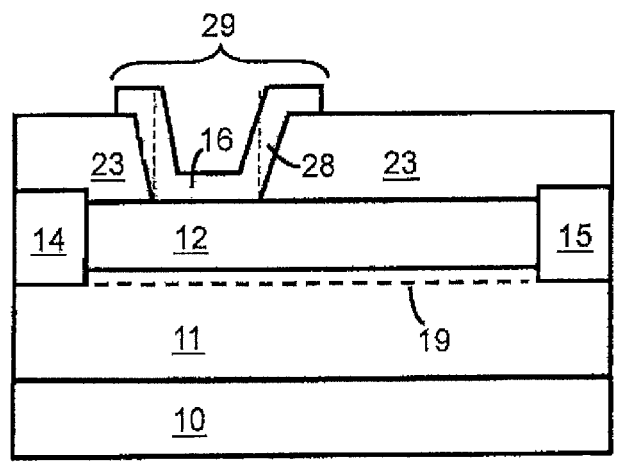
Figure 4:
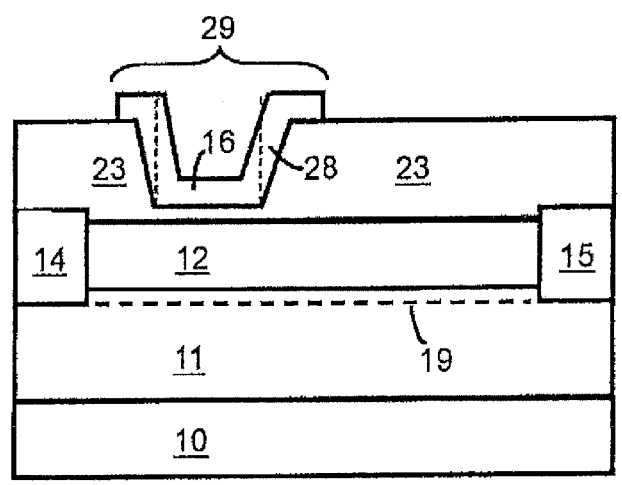
Figure 5:
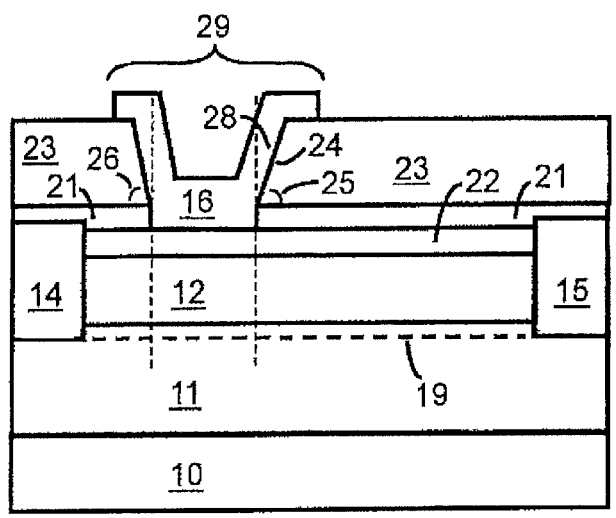
FIG. 5 is a schematic cross-sectional view of a III-N semiconductor transistor containing a gate insulator and a slant field plate.

FIG. 5 shows a schematic illustration of a III-Nitride device, i.e., a III-Nitride HEMT. As used herein, the terms III-Nitride or III-N materials, layers, devices, etc., refer to a material or device comprised of a compound semiconductor material according to the stoichiometric formula $Al_xIn_yGa_zN$, where x+y+z is about 1. The device includes a substrate layer 10, which can include or be formed of silicon, sapphire, GaN, AlN, SiC, or any other substrate suitable for use in III-N devices. In some embodiments, a substrate is not included. For example, in some embodiments the substrate is removed prior to completion of device fabrication. III-N layers 11 and 12, which are formed on top of substrate 10, are III-N materials that form the basis for the HEMT device. III-N layers 11 and 12 have different compositions, the compositions chosen such that a 2DEG channel 19 is induced in layer 11, which is hereby referred to as "channel layer 11". Some or all of the III-N material in layer 12 has a bandgap which is larger than that of channel layer 11, so layer 12 is hereby referred to as "barrier layer 12". In some embodiments, channel layer 11 is GaN and barrier layer 12 is $Al_xGa_{1-x}N$, where x is between 0 and 1. It is understood that modifications to the III-N material structure can be made, as long as the resulting structure is one with which a III-N HEMT or other III-N device, such as an HFET, MISHFET, MOSFET, MESFET, JFET, CAVET, POLFET, HEMT, FET, diode, or another device can be formed. For example, additional III-N layers can also be included, such as a III-N buffer layer between the substrate 10 and the overlying III-N layers, or an AlN layer between the channel layer 11 and barrier layer 12. The III-N layers can be oriented in the [0 0 0 1] (III-face or Ga-face C-plane) polar direction, the [0 0 0 1 bar] (N-face) polar direction, or any other polar, semi-polar, or non-polar orientation. In some embodiments, the barrier layer 12 is between the substrate 10 and the channel layer 11, such as when the III-N materials are oriented in a [0 0 0 1 bar] direction or in a nitrogen-terminated semi-polar direction or in a non-polar direction. As such, while the uppermost III-N layer, i.e., the III-N layer furthest from the substrate, is shown in FIG. 5 to be the barrier layer 12, in some embodiments the uppermost III-N layer can be the channel layer 11 or another III-N layer.

The device structure can be designed such that the resulting III-N device is a depletion-mode device, such that the 2DEG channel 19 is induced in the gate region and access regions of channel layer 11 when zero voltage is applied to the gate relative to the source. Or, the III-N device can be an enhancement-mode device, such that the 2DEG channel 19 is induced in the access regions but not the gate region of channel layer 11 when zero voltage is applied to the gate relative to the source, and a positive voltage must be applied to the gate to induce a 2DEG in the gate region of channel layer 11. As used herein, the term "gate region" refers to the region in the III-N materials directly beneath gate 16, i.e. between the two vertical dashed lines in FIG. 5. The term "access regions" refers to the regions of the device which are on either side of the gate region and between the source and drain electrodes 14 and 15, respectively. Thus, the access regions can be at least partially beneath the slant field plate 28.

In some embodiments, the III-N layer structure in the gate region is different from that in the access regions (not shown). For example, the access regions can include III-N layers that are not included in the gate region, or vice-versa. In some embodiments, the uppermost III-N layer is recessed in the gate region (not shown). The recess in the uppermost III-N layer can extend part way through the layer, such that a portion of the uppermost III-N layer is removed in the gate region. Or, the recess can extend all the way through the uppermost III-N layer and into the III-N layer directly beneath the uppermost III-N layer, such that all of the uppermost III-N layer and a portion of the layer below the uppermost III-N layer are removed in the gate region. Additional examples of III-N layer structures for III-N devices can be found in U.S. Pat. No. 7,915,643, U.S. Pat. No. 7,795,642, U.S. Pat. No. 7,851,825, U.S. Pat. No. 8,519,438, U.S. Pat. No. 7,898,004, U.S. Pat. No. 7,884,394, and U.S. Patent Publication No. 2009/0072269, all of which are hereby incorporated by reference.

Source and drain electrodes 14 and 15, respectively, which are formed on opposite sides of the gate region, contact the 2DEG channel 19 in channel layer 11. A gate insulator layer 22 is adjacent to the uppermost III-N surface and extends at least from the source electrode 14 to the drain electrode 15. When an uppermost III-N layer is the same layer in both the gate and access regions, as is the case for the device shown in FIG. 5, the uppermost III-N surface refers to the surface of the uppermost III-N layer which is opposite the substrate 10. In some embodiments, an uppermost III-N layer in the gate region is different from that in the access regions, and in these embodiments the uppermost III-N surface includes all surfaces of uppermost III-N layers which are on a side of the device opposite the substrate, including any vertical or angled surfaces that may result from steps, recesses, or discontinuities in uppermost III-N layers.

Gate insulator layer 22 is formed of any insulating film that can be made thin, such as less than about 50 nm, such as less than or about 22 nm, 18 nm, or 15 nm, in order to insure sufficiently high gate capacitance, while preventing substantial current from flowing from the gate 16 to the drain electrode 15 through the 2DEG channel 19. For example, gate insulator layer 22 can be about 2-50 nm thick, can be formed of $SiO_2$ or SiN, and can be deposited by methods such as chemical vapor deposition (CVD), metalorganic chemical vapor deposition (MOCVD), high-temperature chemical vapor deposition (HTCVD) sputtering, evaporation, or other suitable deposition techniques. In some embodiments, gate insulator layer 22 is formed of a high permittivity (high-K) dielectric such as $HfO_2$, $Ti_2O_5$, or $ZrO_2$. A high-K dielectric results in a higher gate capacitance as compared to the case when a lower permittivity dielectric of the same thickness is used. Consequently, when a high-K dielectric is used, gate insulator layer 22 may not need to be made as thin as when a lower permittivity dielectric is used. For example, when a high-K dielectric is used, it may be possible to achieve a sufficiently large gate capacitance if the thickness of the gate insulator layer is about 2000 nm or less, about 1000 nm or less, or about 500 nm or less.

Gate insulator layer 22 can be made thick enough to prevent substantial leakage currents, i.e., leakage currents greater than about 100 microamperes, from flowing through gate insulator layer 22 during device operation. For example, it may be necessary to make gate insulator layer 22 greater than about 2 nm to substantially suppress leakage currents. In some embodiments, the device is a depletion mode device (i.e., the device threshold voltage is less than 0V), and the thickness of gate insulator layer 22 is chosen such that the device has a threshold voltage of about −30V or greater (i.e., less negative), such as between about −30V and 0 V. The threshold voltage of the device is the maximum voltage at which the 2DEG in the gate region is substantially depleted of charge, i.e., has a charge density less than about 1% of the maximum 2DEG charge density in the device. In other embodiments, the thickness of gate insulator layer 22 is chosen such that the capacitance per unit area of the layer is about 0.8-40 millifarads/meter$^2$.

Since gate insulator layer 22 directly contacts the uppermost III-N surface in the device access regions, it can also be capable of serving as an effective surface passivation layer, either on its own or in combination with the overlying layers in the access regions, as will be described below. As used herein, a "passivation layer" refers to any layer or combination of layers grown or deposited on top of uppermost III-N layers in a III-N device which can prevent or suppress voltage fluctuations at the uppermost III-N surface in the access regions during device operation. For example, a passivation layer may prevent or suppress the formation of surface/interface states at the uppermost III-N surface, or it may prevent or suppress the ability of surface/interface states to trap charge during device operation.

In III-N devices, voltage fluctuations at uppermost III-N surfaces, often caused by the charging of surface states during device operation, are known to lead to undesired effects such as dispersion. Dispersion refers to a difference in observed current-voltage (I-V) characteristics when the device is operated under RF or switching conditions as compared to when the device is operated under DC conditions. A thin, e.g., 22 nm, SiN layer deposited by MOCVD has been shown to form a particularly effective gate insulator for III-N devices while simultaneously serving as an adequate passivation layer in the access regions when combined with appropriate overlying layers 21 and 23, as will be described below.

In some implementations, an etch stop layer 21 is formed in the device access regions directly adjacent to gate insulator layer 22, on top of which is formed an electrode defining layer 23. The electrode defining layer 23 has a recess located between the source electrode 14 and drain electrode 15, i.e., in the region between the device access regions. In some embodiments, the etch stop layer 21 is also recessed in this region. An electrode 29 is conformally deposited in the recess. The electrode 29 overlies the gate region and extends towards the drain electrode 15 such that a portion of electrode 29 overlies a portion of electrode defining layer 23. The portion of electrode 29 that overlies the gate region, i.e., is between the two vertical dashed lines, is the gate 16, and the portion of electrode 29 adjacent to gate 16 on a side closest to drain electrode 15 is a slant field plate 28.

As is apparent from FIG. 5, the shape of the slant field plate is in part defined by the shape of the recess, i.e., the profile of sidewall 24 of electrode defining layer 23. As used herein, a "slant field plate" is a field plate for which at least a portion of the underlying surface defining the shape of the field plate is at an angle between about 5 degrees and 85 degrees, such as between about 10 degrees and 70 degrees, relative to the uppermost III-N surface in the gate region. For example, slant field plate 28 in FIG. 5 is defined to be a slant field plate if angle 25 is between about 5 degrees and 85 degrees. Additionally, sidewall 24 does not need to have a linear profile, it can have a profile which is linear, parabolic, or some other shape, as long as at least a substantial portion of sidewall 24 is at an angle of between about 5 degrees and 85 degrees relative to the uppermost III-N surface in the gate region. In some embodiments, the angle of the substantial portion of the underlying surface defining the shape of the field plate, relative to the uppermost III-N surface in the gate region, is between about 30 and 45 degrees.

The portion of electrode defining layer 23 that is on the side of the gate closest to the source electrode 14 can also be sloped in the region adjacent to electrode 29, where the slope in this region is defined by angle 26. The slope in this region can be constant or can vary. In some embodiments, angles 25 and 26 are about the same, whereas in other embodiments they are different. It can be advantageous for the sidewall whose slope is given by angle 26 to be steeper than sidewall 24, as this can reduce the gate-source capacitance. In some embodiments, angle 26 is between about 45 and 90 degrees, such as between about 80 and 90 degrees.

In order to form an electrode defining layer 23 with a sidewall 24 that meets the specifications required for the formation of a slant field plate and simultaneously allow for a gate insulator layer 22 for which the thickness in the region below gate 16 can be controlled with sufficient accuracy, the following fabrication procedures can be used. After deposition or growth of gate insulator layer 22 on a series of III-N layers, etch stop layer 21 is deposited over the entire structure, after which electrode defining layer 23 is deposited everywhere over etch stop layer 21. Next, an etch process with the following properties is used to remove a portion of the material of electrode defining layer 23, which resides above the gate region. The etch process etches the material of electrode defining layer 23 and yields sidewalls such as those described for sidewall 24, but it does not substantially etch the material of etch stop layer 21. In some implementations, the etch process etches the material of electrode defining layer 23 at a substantially higher rate than it etches the material of etch stop layer 21, such as at least about 10 times higher a rate or between about 10 and 10,000 times higher a rate. In other words, the etch process etches electrode defining layer 23 with a selectivity of about 10:1 or higher. In one embodiment, the etch process is a dry etch, such as reactive ion etching (RIE) or inductively coupled plasma etching (ICP), wherein the etch mask includes two layers of photoresist, i.e., a double-layer resist process, where in the unmasked regions the underlying photoresist layer undercuts the overlying photoresist layer. A complete description of this process can be found in the article "HIGH BREAKDOWN VOLTAGE ACHIEVED ON ALGAN/GAN HEMTS WITH INTEGRATED SLANT FIELD PLATES", published by Dora et al. in IEEE Electron Device Letters, Vol. 27, No. 9, pp. 713-715, which is hereby incorporated by reference throughout. In another embodiment, the etch process is a dry etch, such as reactive ion etching (RIE) or inductively coupled plasma etching (ICP), wherein the photoresist used as an etch mask has a slanted sidewall and can also be etched by the dry etch technique used.

Next, a second etch process with the following properties is used to remove a portion of the material of etch stop layer 21 which resides above the gate region. The second etch process etches the material of etch stop layer 21, but it does not substantially etch the material of gate insulator layer 22. The second etch process may etch the material of etch stop layer 21 at a substantially higher rate than it etches the material of gate insulator layer 22, such as at least about 10 times higher a rate or between about 10 and 10,000 times higher rate. In some embodiments, the second etch process also cannot substantially etch the material of electrode defining layer 23.

Etch stop layer 21 can be formed of an insulating material, such as AlN, SiN, SiO$_2$, or another insulating material, which has a different composition or is a different material than that of gate insulator layer 22. The different materials or compositions allow for the selectivity of the etching steps. Specifically, etch stop layer 21 can be formed of a material for which an etch process exists that can etch the material of etch stop layer 21 without substantially etching any of the material of gate insulator layer 22. For example, when gate insulator layer 22 is formed of SiN, etch stop layer 21 can be formed of AlN, because a KOH-based wet etch, which does not substantially etch SiN, can be used to etch AlN. Furthermore, if etch stop layer 21 is thin, such as less than about 15 nm, such as about 5 nm, substantial lateral etching of etch stop layer 21 can be prevented. Lateral etching can result in an undercut beneath electrode defining layer 23 in the region adjacent to gate 16. If an undercut is present in this region, then it is possible that the uppermost III-N surface will not be sufficiently passivated in the region directly below the undercut, which can lead to undesirable effects such as dispersion. In some embodiments, etch stop layer 21 is formed of AlN deposited by sputter deposition and is about 5 nm thick.

Electrode defining layer 23 is formed of an insulating material, such as AlN, SiN, or SiO$_2$, which has a different composition or is a different material than that of etch stop layer 21. The different materials or compositions allow for the selectivity of the etching steps. Specifically, electrode defining layer 23 can be formed of a material for which an etch process exists that can etch the material of electrode defining layer 23 and yield sidewalls such as those described for sidewall 24 while not substantially etching the material of etch stop layer 21. For example, when etch stop layer 21 is formed of AlN, electrode defining layer 23 can be formed of SiN, since a Fluorine-based dry etch exists which etches SiN, does not substantially etch AlN, and can yield sidewalls such as those described for sidewall 24 when an appropriate photoresist etch mask, as previously described, is used. Additionally, in order to optimize the reduction in peak electric field that results from the slant field plate, electrode defining layer 23 can be about 100 nm thick or thicker, such as between about 100 nm and 200 nm thick, such as about 120 nm thick. The optimal thickness for the electrode defining layer 23 depends in part on the operating voltage of the device within the circuit or module in which it is used. For example, if a larger operating voltage is to be used, it may be advantageous to have a thicker electrode defining layer 23, such as between about 200 nm and 2000 nm. In some embodiments, electrode defining layer 23 is formed of SiN deposited by Plasma Enhanced Chemical Vapor Deposition (PECVD) and is about 120 nm thick.

Gate insulator layer 22, etch stop layer 21, and electrode defining layer 23 in combination can form a suitable passivation layer in the device access regions. Gate insulator layer 22, which is adjacent to the uppermost III-N surface, can prevent or suppress the formation of surface/interface states at the uppermost III-N surface, or it can prevent or suppress the ability of surface/interface states to trap charge during device operation. To adequately prevent or suppress dispersion caused by surface/interface states at the uppermost III-N surface, gate insulator layer 22 may need to be about 2 nm thick or thicker. However, making gate insulator layer 22 thicker can reduce the device transconductance, thereby degrading device performance.

Figure 12B:
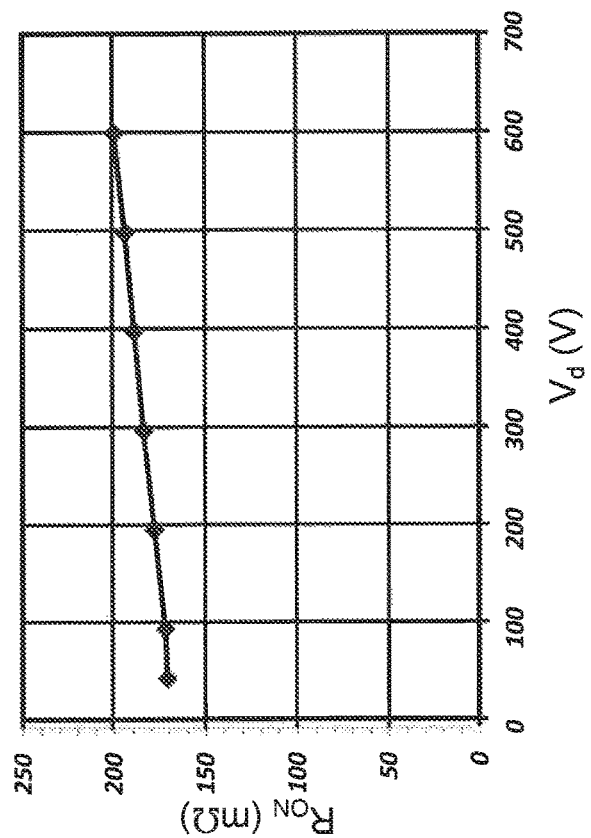
FIGS. 12b and 12c are graphs showing on-resistance versus drain voltage for III-N semiconductor transistors.
Figure 12A:
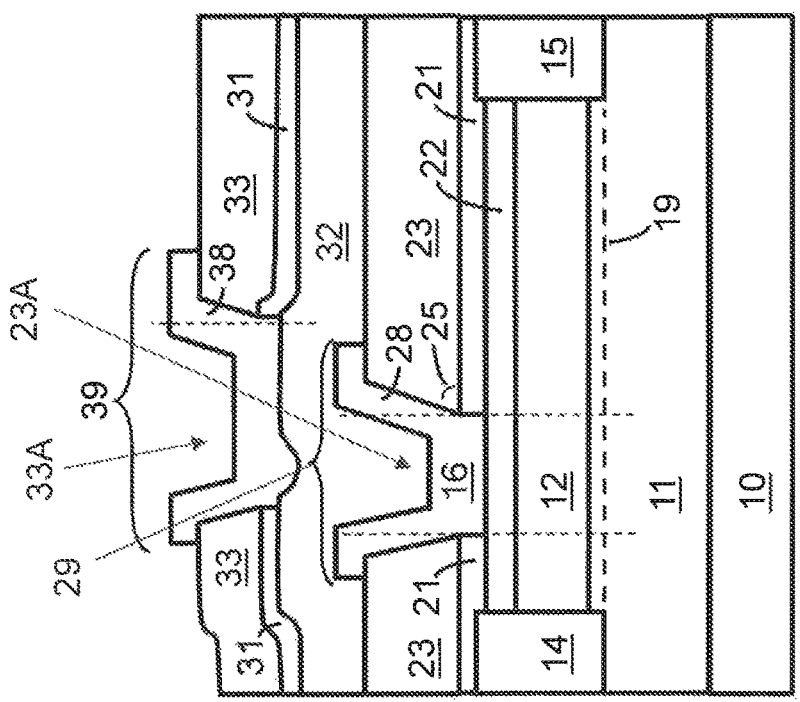
FIG. 12a is a schematic cross-sectional view of an example of a III-N semiconductor transistor containing a gate insulator and slant field plates.
Figure 13:
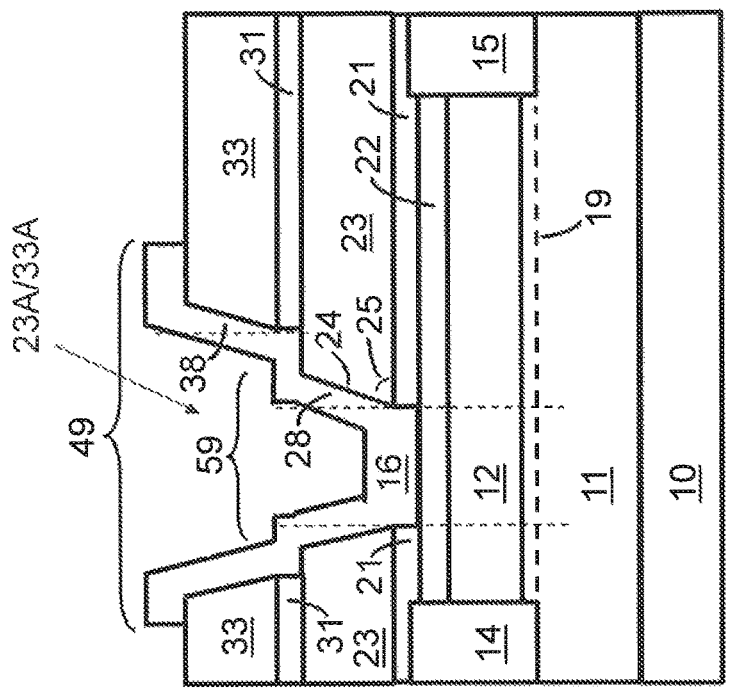
FIG. 13 is a schematic cross-sectional view of a III-N semiconductor transistor containing a gate insulator and slant field plates.

To prevent voltage fluctuations at the surface of electrode defining layer 23 on a side opposite the etch stop layer 21 from causing substantial dispersion, the combined thickness of the electrode defining layer 23 and the gate insulator 22 can be sufficiently large, such as about 100 nm thick or thicker. The minimum combined thickness of these two layers that can be required to substantially suppress dispersion depends on the operating voltage (i.e., the maximum voltage difference between the source and drain during operation) of the device. For example, for operation up to about 50 V, the combined thickness can be about 120 nm or thicker, for operation up to about 300 V, the combined thickness can be about 800 nm or thicker, and for operation up to about 600 V, the combined thickness can be about 1800 nm or thicker. Since it can be desirable for the thickness of the gate insulator layer 22 to be small, such as about 20 nm, the thickness of the electrode defining layer 23 can be almost as large as or about the same as the minimum combined thickness of the two layers. Because thick individual layers can be difficult to fabricate, it may be necessary to form additional layers in order to achieve the minimum combined layer thicknesses required to substantially suppress dispersion at higher operating voltages. Such devices are shown in FIGS. 12a and 13 and are further described below.

In conventional III-N devices, a single SiN layer, that is, a layer that is not used in combination with an etch stop layer or electrode defining layer, of thickness greater than about 30 nm has been shown to be a suitable passivating layer in many cases. A thicker single SiN layer can result in improved passivation, or in effective passivation at higher device operating voltages, as compared to a thinner single SiN layer. For the device of FIG. 5, it has been shown that suitable passivation can be achieved for device operation up to about 50 V when a 2-50 nm MOCVD grown SiN layer is used for gate insulator layer 22, a 1-15 nm AlN layer deposited by sputter deposition is used for etch stop layer 21, and a 100-200 nm SiN layer deposited by PECVD is used for electrode defining layer 23. It has also been shown that increasing the thickness of the etch stop layer 21 can cause the device to experience greater dispersion, thus degrading the device performance. For example, devices were fabricated for which the only parameter which was varied was the thickness of the AlN etch stop layer 21. These devices exhibited increased dispersion for increased thickness of the AlN etch stop layer 21.

A III-N device with a slant field plate and a gate insulator can also be achieved by omitting the etch stop layer 21 in FIG. 5 and choosing a material for the electrode defining layer 23 that can be etched by an etch process that selectively etches the material of electrode defining layer 23 without substantially etching the material of gate insulator layer 22. However, the structure of FIG. 5 may be advantageous as compared to this structure because it can be difficult to find a material for gate insulator layer 22 which serves as a suitable gate insulator for III-N devices while at the same time serving as an etch stop layer for the material of electrode defining layer 23 and simultaneously serving as a suitable passivation layer in conjunction with the material of electrode defining layer 23.

Figure 6:
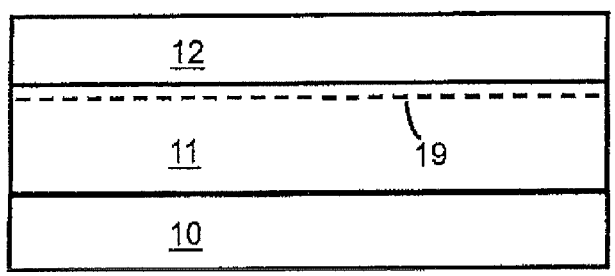
FIGS. 6-11 illustrate a method of forming the III-N semiconductor transistor of FIG. 5.
Figure 7:
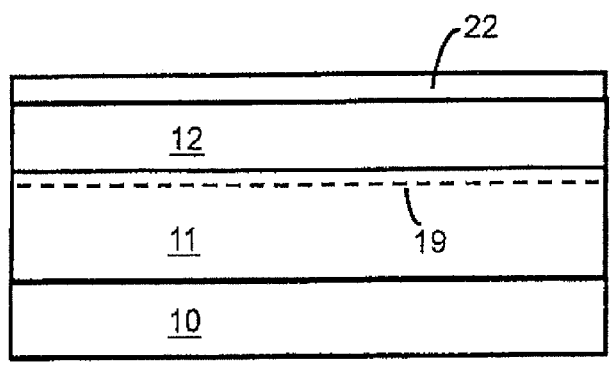

A method of forming the device in FIG. 5 is illustrated in FIGS. 6-11. Referring to FIG. 6, a series of III-N layers which at least includes a channel layer 11 and a barrier layer 12 is formed on a substrate 10, resulting in the formation of a 2DEG 19 in channel layer 11. The III-N layers can be grown epitaxially by a method such as MOCVD, MBE, HVPE, or another method. Next, as seen in FIG. 7, gate insulator layer 22 is formed on top of the series of III-N layers. Gate insulator layer 22 can be grown or deposited by methods such as MOCVD, PECVD, high temperature CVD (HTCVD), sputtering, evaporation, or another method. In some embodiments, gate insulator layer 22 is formed by a similar or the same method as the III-N layers, and can be formed in the same step. For example, the III-N layers and gate insulator layer 22 can all be deposited or grown by MOCVD.

Figure 8:
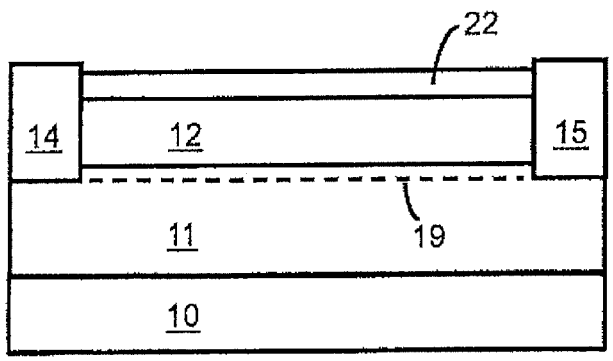

Next, referring to FIG. 8, gate insulator layer 22 is removed in the region containing source and drain electrodes 14 and 15, respectively, and source and drain electrodes 14 and 15, which contact the 2DEG 19, are formed by a method such as evaporation, sputtering, PECVD, HTCVD, or another method. In some embodiments, source and drain electrodes 14 and 15 are formed prior to the formation of gate insulator layer 22.

Figure 9:
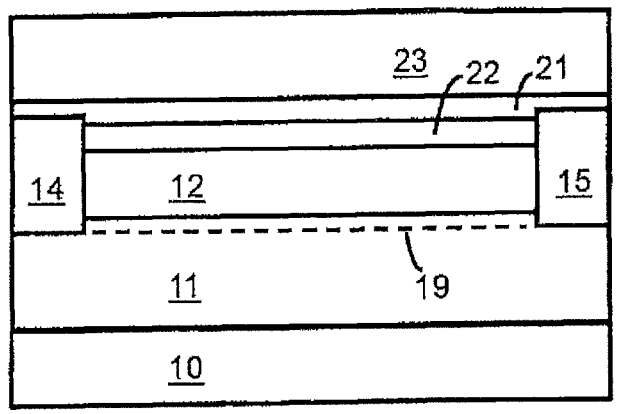
Figure 10:
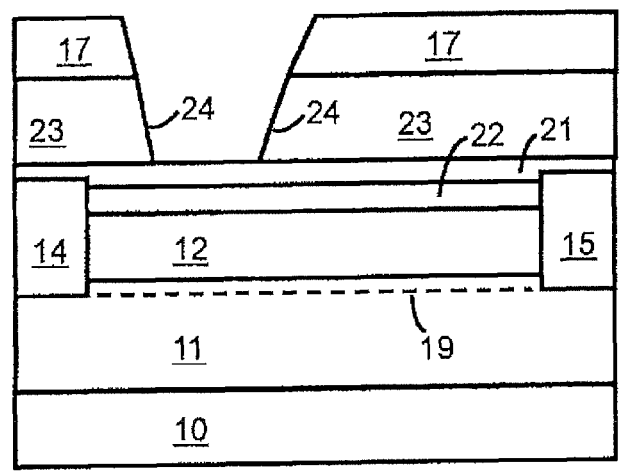
Figure 11:
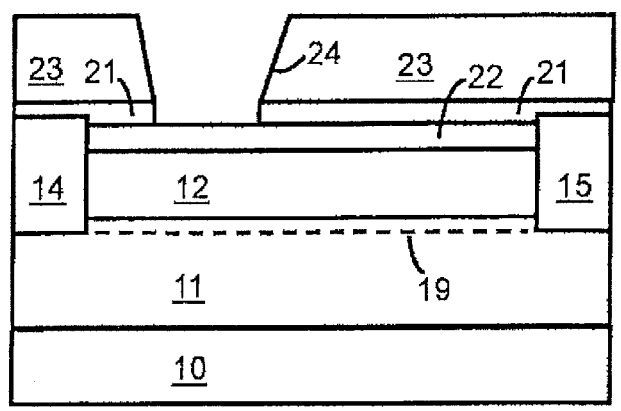

Referring to FIG. 9, etch stop layer 21 is then formed atop gate insulator layer 22, on top of which is formed electrode defining layer 23. Next, as seen in FIG. 10, an etch mask 17, such as photoresist, is deposited atop electrode defining layer 23 in the regions shown, and electrode defining layer 23 is etched in the unmasked regions using a technique that etches the material of electrode defining layer 23 but does not substantially etch the material of etch stop layer 21. The etching results in slanted sidewalls 24 in the etched region. Thus, the etch can stop precisely at the interface of electrode defining layer 23 and etch stop layer 21. Referring to FIG. 11, etch mask 17 is removed, and etch stop layer 21 is etched in the gate region using a technique that etches the material of etch stop layer 21 but does not substantially etch the material of etch electrode defining layer 23 or of gate insulator layer 22. The etch stop layer has a main surface, which is the surface that interfaces with the electrode defining layer and is exposed when the electrode defining layer is etched through. Thus, the etch can stop precisely at the interface of etch stop layer 21 and gate insulator layer 22. Finally, electrode 29, which includes gate 16 and slant field plate 28, is formed, resulting in the device shown in FIG. 5.

In one embodiment of the device shown in FIG. 5, the III-N layers and gate insulator layer 22 are all grown by MOCVD and are formed in a single growth step. Gate insulator layer 22 includes or is formed of SiN and is about 22 nm thick. Etch stop layer 21 includes or is formed of AlN which is deposited by evaporation or sputtering and is about 5 nm thick. Electrode defining layer 23 includes or is formed of SiN, is deposited by PECVD, and is about 120 nm thick. Etch mask 17, shown in FIG. 10, is photoresist and is patterned in such a way that the sidewall is substantially slanted. Alternatively, the etch mask can be a double-layer photoresist, where the underlying photoresist layer is undercut relative to the overlying photoresist layer. Electrode defining layer 23 is removed in the gate region using a Fluorine-based dry etch, such as RIE or ICP, which etches SiN, does not substantially etch AlN, and yields sidewalls such as those described for sidewall 24 in FIG. 5 when a photoresist with substantially sloped sidewalls or a double-layer photoresist is used as an etch mask. Etch stop layer 21 is removed in the gate region using a KOH-based wet etch which etched AlN but does not substantially etch SiN.

Devices such as the one shown in FIG. 5 with a single field plate have been fabricated for which the dynamic on-resistance (as measured when the device is switched from the OFF state, with a source-drain bias of up to 40V, to the ON state) is no more than 1.2 times the DC on-resistance ($R_{ON}$). The average DC $R_{ON}$ for a saturation current of 50 mA/mm was found to be about 11.5 ohm-mm, while the average dynamic $R_{ON}$, measured when the device was switched while a source-drain bias of 40V was applied, was found to be about 11.9 ohm-mm. In semiconductor transistors used in switching applications, dispersion can lead to an increase in the dynamic on-resistance of the device. In devices without a slant field plate such as that in the device of FIG. 5, dispersion can lead to dynamic on-resistances that are too large for the application in which the device is being used. Dispersion in the device of FIG. 5 can be kept sufficiently small, i.e., dispersion is substantially suppressed, such that the dynamic on-resistance is acceptable for the device applications.

Figure 12C:
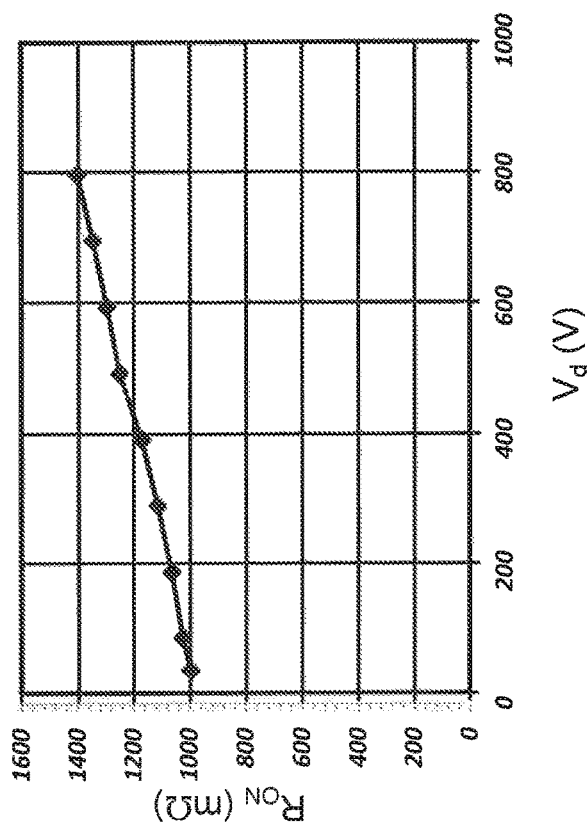
Figure 12D:
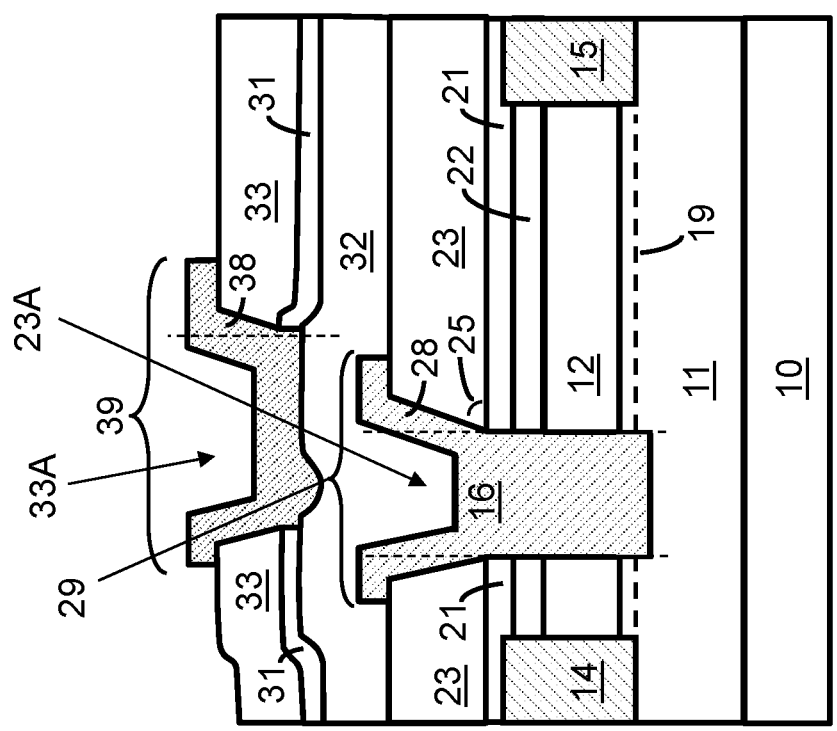
FIG. 12d is a schematic cross-sectional view of another example of a III-N semiconductor transistor containing a gate insulator and slant field plates.

Schematic diagrams of embodiments of a device which includes a gate insulator and two slant field plates are shown in FIG. 12a and in FIG. 12d. The device of each of FIG. 12a and FIG. 12d is the same as the one shown in FIG. 5, but further includes an insulator layer 32, a second etch stop layer 31, a second electrode defining layer 33, and an electrode 39 which includes a second slant field plate 38, the electrode 39 being deposited in a second recess 33A. As compared to the device of FIG. 5, the addition of a second slant field plate 38 can further decrease the peak electric field in the device during device operation, thereby further increasing the device breakdown voltage and decreasing dispersion, or resulting in sufficiently low dispersion at higher voltages than may be possible with the device of FIG. 5.

The second electrode defining layer 33 and second etch stop layer 31 can be similar to those of electrode defining layer 23 and etch stop layer 21, respectively. That is, the second electrode defining layer 33 can be formed of an insulating material, such as AlN, SiN, or $SiO_2$, which has a different composition or is a different material than that of the second etch stop layer 31. Additionally, the second electrode defining layer 33 can be comprised of a material for which an etch process exists that can etch the material of electrode defining layer 33 and yield slanted sidewalls, such as those described for sidewall 24 in FIG. 5, while not substantially etching the material of the second etch stop layer 31. For example, when the second etch stop layer 31 is AlN, the second electrode defining layer 33 can be SiN, since a Fluorine-based dry etch exists which etches SiN, does not substantially etch AlN, and can yield sidewalls such as those described for sidewall 24 in FIG. 5 when a suitable photoresist etch mask is used. In some embodiments, the second electrode defining layer 33 is between about 10 nm and 1000 nm thick, such as about 500 nm thick. In some embodiments, the second electrode defining layer 33 is formed of SiN deposited by Plasma Enhanced Chemical Vapor Deposition (PECVD) and is about 500 nm thick.

The second etch stop layer 31 can be formed of an insulating material, such as AlN, SiN, or $SiO_2$, which has a different composition or is a different material than that of the underlying insulator layer 32 and different from that of the second electrode defining layer 33. The second etch stop layer 31 can be comprised of a material for which an etch process exists that can etch the material of etch stop layer 31 without substantially etching any of the material of the underlying insulator layer 32 or of the second electrode defining layer 33. For example, when the underlying insulator layer 32 and the second electrode defining layer 33 are SiN, the second etch stop layer 31 can be AlN, since a KOH-based wet etch which does not substantially etch SiN can be used to etch AlN. Furthermore, the second etch stop layer 31 can be thin, such as less than about 15 nm, such as about 5 nm thick, in order to prevent substantial lateral etching of the second etch stop layer 31 that can result in an undercut beneath the second electrode defining layer 33. In some embodiments, the second etch stop layer 31 is formed of AlN deposited by sputter deposition and is about 5 nm thick.

A method of forming electrode 39 and the adjacent layers in the device shown in each of FIG. 12*a* and FIG. 12*d* is similar or the same to that described for the formation of the electrode 29 and the adjacent layers in the device of FIG. 5. Additionally, electrode 39 and electrode 29 (that have been deposited in the first recess 23A and the second recess 33A, respectively) can be electrically connected, either externally or on the device periphery, such that the second slant field plate 38 is a gate-connected field plate (not shown). As used herein, two or more contacts or other items are said to be "electrically connected" if they are connected by a material which is sufficiently conducting to ensure that the electric potential at each of the contacts or other items is intended to be the same, i.e., is about the same, at all times. Furthermore, additional slant field plates, which can also be gate-connected field plates, can be added to this device using a similar or the same process and structure described for electrode 39 and the adjacent layers.

Insulator layer 32, which can be SiN, separates electrode 39 from electrode 29 and can protect electrode 29 from being damaged when the second etch stop layer 31 is etched. In some embodiments, insulator layer 32 is not included, in which case electrode 39 can be directly connected to electrode 29 within the active device area.

In one embodiment of the device shown in FIG. 12*a*, the III-N layers and gate insulator layer 22 are all grown by MOCVD and are formed in a single growth step. Gate insulator layer 22 is SiN and is about 22 nm thick. Etch stop layer 21 includes or is formed of AlN, deposited by evaporation or sputtering, and is about 5 nm thick. Electrode defining layer 23 is SiN, deposited by PECVD, and is about 120 nm thick. Etch mask 17, shown in FIG. 10, is formed of photoresist and is patterned in such a way that the sidewall is either substantially slanted or has an undercut so that a trench with slant sidewalls can be defined in the underlying electrode defining layer 23. Electrode defining layer 23 is removed in the gate region using a Fluorine-based dry etch, such as RIE or ICP, which etches SiN, does not substantially etch AlN, and yields sidewalls such as those described for sidewall 24 in FIG. 5 when a suitable photoresist etch mask is used. Etch stop layer 21 is removed in the gate region using a KOH-based wet etch which etched AlN but does not substantially etch SiN. Insulator layer 32 is SiN, deposited by PECVD, and is about 200 nm thick. In the embodiment of the device shown in FIG. 12*d*, in addition to the foregoing operation, the III-N materials are recessed in the in the gate region all the way through III-N barrier layer 12 and part way through III-N channel layer 11, such that the recess extends through the region which contained the 2DEG. Referring again to both embodiments shown in FIGS. 12*a* and 12*d*, the second etch stop layer 31 is AlN, deposited by evaporation or sputtering, and is about 5 nm thick. The second electrode defining layer 33 is SiN, deposited by PECVD, and is about 500 nm thick. The second electrode defining layer 33 is etched using a Fluorine-based dry etch, such as RIE or ICP, which etches SiN, does not substantially etch AlN, and yields sidewalls such as those described for sidewall 24 in FIG. 5 when a suitable photoresist etch mask is used. The second etch stop layer 31 is etched using a KOH-based wet etch which etches AlN but does not substantially etch SiN.

Devices such as the one shown in FIG. 12*a* with two slant field plates have been fabricated for which the dynamic on-resistance (as measured when the device is switched from the OFF state, with a source-drain bias of up to 200 V, to the ON state) is no more than 1.2 times the DC on-resistance ($R_{ON}$). The average DC $R_{ON}$ for a saturation current of 50 mA/mm was found to be about 11.5 ohm-mm, while the average dynamic $R_{ON}$, measured when the device was switched while a source-drain bias of 200V was applied, was also found to be about 11.5 ohm-mm. In semiconductor transistors used in switching applications, dispersion can lead to an increase in the dynamic on-resistance of the device. In devices without multiple slant field plates such as those in the device of FIG. 12*a*, dispersion can lead to dynamic on-resistances that are too large for the application in which the device is being used. Dispersion in the device of FIG. 12*a* can be kept sufficiently small, i.e., dispersion is substantially suppressed, such that the dynamic on-resistance is acceptable for the device applications.

Devices similar to the one shown in FIG. 12*a*, but with three slant field plates, have been fabricated for which the dynamic on-resistance (as measured when the device is switched from the OFF state, with a source-drain bias of up to 600 V, to the ON state) is no more than 1.2 times the DC on-resistance ($R_{ON}$). A graph showing average $R_{ON}$ versus drain voltage $V_d$ for these devices is shown in FIG. 12*b*. The average DC $R_{ON}$ for these devices was about 170 milli-ohms, while the average dynamic $R_{ON}$, measured when the device was switched from the OFF state, with a source-drain bias of 600 V, to the ON state, was found to be about 200 milli-ohms.

Devices similar to the one shown in FIG. 12*a*, but with four slant field plates, have been fabricated for which the dynamic on-resistance (as measured when the device is switched from the OFF state, with a source-drain bias of up to 800 V, to the ON state) is no more than 1.4 times the DC on-resistance ($R_{ON}$). A graph showing average $R_{ON}$ versus drain voltage $V_d$ for these devices is shown in FIG. 12*c*. The average DC $R_{ON}$ for these devices was about 1000 milli-ohms, while the average dynamic $R_{ON}$, measured when the device was switched from the OFF state, with a source-drain bias of 800 V, to the ON state, was found to be about 1400 milli-ohms.

Another device, which includes a gate insulator 22 and two slant field plates 28 and 38, is shown in FIG. 13. This device is similar to the one shown in FIG. 12, except that the two slant field plates 28 and 38 are connected to one another in the active device area and can be formed with a single metal deposition. For example, electrode 49, which includes the device gate 16 as well as slant field plates 28 and 38, can be deposited in a single step. This can be advantageous as compared to the device of FIG. 12*a*, since the manufacturing process can be simplified and the gate resistance may be reduced.

Electrode 49 and the layers adjacent to electrode 49 in the device of FIG. 13 can be formed as follows. Gate insulator layer 22, first etch stop layer 21, first electrode defining layer 23, second etch stop layer 31, and second electrode defining layer 33 are all deposited above the active semiconductor device layers. An etch mask, such as photoresist, is then patterned on top of layer 33, and an aperture is etched in layer 33 using an etch process which does not etch the material of layer 31 and results in slanted sidewalls in layer 33, as previously described. The portion of layer 31 adjacent to the aperture is then etched using a process which etches the material of layer 31 but not that of layers 33 or 23. The etch mask which was deposited and patterned on top of layer 33 is removed, either before or after the etching of layer 33. Next, a second etch mask, such as photoresist, is deposited over the device such that the exposed surfaces of layers 33 and 31, as well as the exposed portion of layer 23 outside of region 59, are covered by the etch mask material, but the exposed portion of layer 23 with region 59 is not covered by the etch mask material. Next, an aperture is etched in layer 23 using an etch process which does not etch the material of layer 21 and results in slanted sidewalls in layer 23, as previously described. Finally, the second etch mask is removed, and the portion of layer 21 adjacent to the aperture in layer 23 is etched using a process which etches the material of layer 21 but not that of layers 22 or 23.

Figure 14:
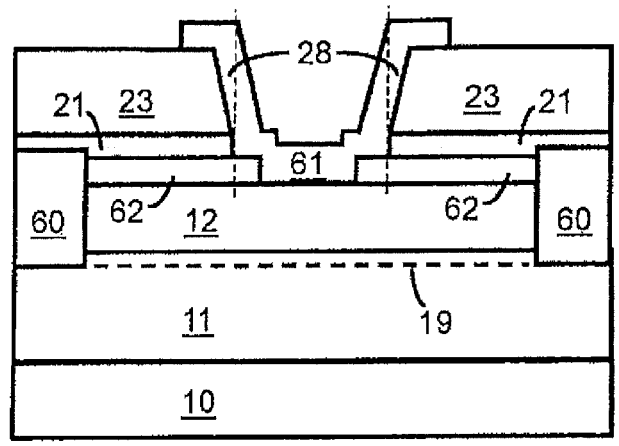
FIGS. 14 and 15 are schematic cross-sectional and plan views, respectively, of a III-N semiconductor diode containing a slant field plate.
Figure 15:
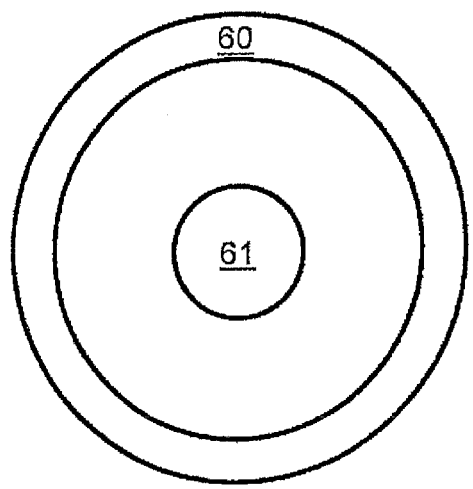

A diode which includes a slant field plate 28 is shown in FIGS. 14 and 15, where FIG. 14 is a cross-sectional view and FIG. 15 is a plan view of the device. The plan view shown in FIG. 15 illustrates the layouts of anode and cathode contacts 61 and 60, respectively. While the anode and cathode contacts on FIG. 15 are shown to be circular in shape, they can in general be any shape appropriate for the layout of the circuit in which they are used. The diode includes III-N channel and barrier layers 11 and 12, which contain a 2DEG channel 19 and are similar to the III-N layers in the device of FIG. 5. Anode contact 61 is formed of a single electrode or a plurality of electrodes and directly contacts the underlying semiconductor materials. Cathode contact 60 contacts the 2DEG channel 19 and is in close proximity to at least a portion of anode contact 61. Cathode contact 60 is an ohmic contact, or exhibits substantially ohmic behavior, and anode contact 61 is a Schottky contact or forms a substantially Schottky contact to the underlying III-N layers. Cathode contact 60 can be a single cathode contact. As used herein, the term "single cathode contact" refers to either a single metallic contact which serves as a cathode, or to a plurality of contacts serving as cathodes which are electrically connected such that the electric potential at each contact is about the same. Anode and cathode contacts 61 and 60 may be any arbitrary shape, although the shape is ideally optimized to minimize the device area required for a given forward current.

Dielectric layer 62 is formed of an insulator or dielectric and is adjacent to the uppermost III-N surface in the device access regions. Dielectric layer 62 is capable of serving as an effective surface passivation layer, either on its own or in combination with the overlying layers in the access regions. Layer 21 is an etch stop layer, and layer 23 is an electrode defining layer, with similar or the same requirements as those of the etch stop and electrode defining layers, respectively, in the device of FIG. 5.

The diode in FIGS. 14 and 15 operates as follows. When the voltage at the anode contact 61 is less than that at the cathode contact 60, such that the Schottky junction between anode contact 61 and III-N layer 12 is reverse biased, the diode is in the OFF state with no substantial current flowing between the anode and cathode. When the voltage at the anode contact 61 is greater than that at the cathode contact 60, the Schottky junction between anode contact 61 and III-N layer 12 is forward biased, and the diode is in the ON state. Electrons flow from the cathode contact 60 predominantly through the 2DEG channel 19 and then through the forward biased Schottky junction into the anode contact 61. That is, at least 99% of the total forward bias current flows from the anode to the cathode through the Schottky barrier and through the 2DEG channel. A small amount of leakage current can flow through other paths, such as along the surface of the device.

Figure 16:
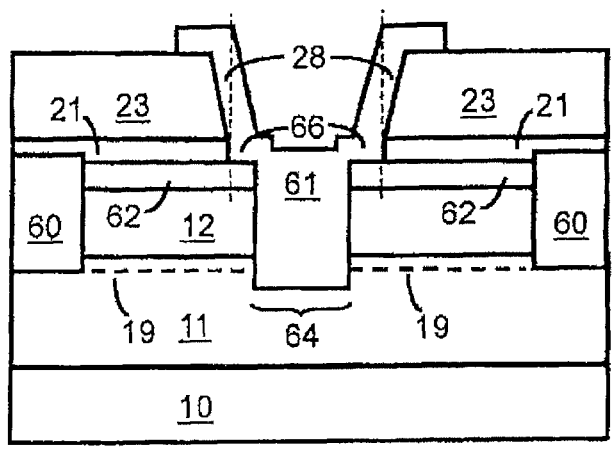
FIG. 16 is a schematic cross-sectional view of a III-N semiconductor diode containing a slant field plate.

The device in FIG. 16 is similar to that of FIG. 14, except that in the anode region 64, the III-N materials are recessed all the way through III-N barrier layer 12 and part way through III-N channel layer 11, such that the recess extends through the region which contained the 2DEG. In this case, anode contact 61 forms a substantially Schottky contact to some or all of the III-N layers which it directly contacts. In some embodiments, the recess only extends part way through III-N layer 12 and does not extend through the region containing the 2DEG channel (not shown). During reverse bias operation, the portion of 2DEG channel 19 directly underneath portion 66 of the anode contact, i.e., the portion of the anode contact directly overlying and adjacent to dielectric layer 62, can be depleted of electrons, thereby reducing reverse leakage currents in the device. The portion of 2DEG channel 19 directly underneath portion 66 of the anode contact is the portion of 2DEG channel in the device access region, i.e., the region between anode region 64 and the cathode contact 60, and limited to a region adjacent to anode region 64. In order for the portion of 2DEG channel 19 directly underneath portion 66 of the anode contact to become depleted of electrons during reverse bias operation, dielectric layer 62 cannot be too thick. In some embodiments, dielectric layer 62 is silicon nitride and is less than about 50 nm, such as between about 2 nm and 50 nm. Dielectric layer 62 can be made thick enough to prevent substantial leakage currents, i.e., leakage currents greater than about 10 microamperes/millimeter, from flowing from the anode to the cathode through dielectric layer 62 in the region directly underneath portion 66 of the anode contact. For example, it may be necessary to make dielectric layer 62 greater than about 2 nm to substantially suppress leakage currents. In some embodiments, the thickness of dielectric layer 62 is chosen such that in the region directly underneath portion 66 of the anode contact, the device has a threshold voltage of about −15V or greater (i.e., less negative or more positive), such as between about −15V and −1V. The threshold voltage of the region directly underneath portion 66 of the anode contact is the maximum voltage at which the 2DEG in this region is substantially depleted of charge, i.e., has a charge density less than about 1% of the maximum 2DEG charge density in the device. In other embodiments, the thickness of gate insulator layer 22 is chosen such that the capacitance per unit area of the layer is about 0.8-40 millifarads/m$^2$. In some embodiments, dielectric layer 62 is SiN and is deposited by metal-organic chemical vapor deposition (MOCVD).

If dielectric layer 62 is a higher K dielectric than silicon nitride, the dielectric layer can be thicker. For example, it may be possible to achieve the desired threshold voltage in the region directly underneath portion 66 of the anode contact by using a high K dielectric for dielectric layer 62 that is thicker than a SiN layer designed to result in the same threshold voltage for this region.

Other features which are well known to be beneficial to device performance can also be included in the structures in FIGS. 5, 12*a*, and 13-16. These include but are not limited to surface treatments to the III-N layers in the gate and/or access regions, or inclusion of a III-N buffer layer, such as a III-N layer with a larger bandgap than that of the channel layer 11, between the channel layer 11 and substrate 10. The semiconductor layers do not need to be III-N layers, but can instead be formed of other semiconductor materials. The field plates do not need to be slant field plates, but can instead be other types of field plates. These features can be used individually or in combination with one another.

What is claimed is:

1. A III-N device, comprising:
   a III-N material layer;
   a first insulator layer on a surface of the III-N material layer, the first insulator layer having a first recess formed therein;
   a first electrode in the first recess;
   a stack on an opposite side of the first insulator layer from the III-N material layer, wherein the stack comprises a second insulator layer, an etch stop layer and an electrode defining layer; and
   a second electrode, wherein a second recess is formed in the electrode defining layer and in the etch stop layer, and the second electrode is in the second recess.

2. The device of claim 1, wherein a portion of the first electrode is over a top surface of the first insulating layer.

3. The device of claim 2, wherein a portion of the second electrode is over a top surface of the electrode defining layer.

4. The device of claim 2, wherein the first recess further extends into the III-N material layer.

5. The device of claim 4, wherein a first portion of the III-N material layer has a first composition and a second portion of the III-N material layer has a second composition, wherein a difference between the first composition and the second composition causes a 2DEG channel to be formed in the III-N material layer.

6. The device of claim 5, wherein the first insulator layer is less than 100 nanometers.

7. The device of claim 1, wherein the recess extends all the way through a first portion of the III-N material layer and into a second portion of the III-N material layer.

8. The device of claim 1, wherein the first electrode includes a field plate.

9. The device of claim 1, wherein the first electrode comprises a gate, and the device further comprises a source and a drain.

10. The device of claim 9, wherein a positive voltage must be applied to the gate to induce a 2DEG in the gate region of the III-N material layer.

11. The device of claim 10, wherein the device is an enhancement-mode device.

12. The device of claim 1, wherein the first insulator layer is formed of an oxide or nitride.

13. The device of claim 1, wherein the second insulator layer and the electrode defining layer is formed of an oxide or nitride.

14. The device of claim 1, wherein the second insulator layer is at least 100 nanometers thick.

15. The device of claim 1, wherein the first insulator layer and the second insulator layer are formed of different materials.

16. A III-N device, comprising:
    a III-N material layer;
    an insulator layer on a surface of the III-N material layer;
    a first electrode defining layer on an opposite side of the insulator layer from the III-N material layer;
    a first electrode, wherein a first recess is formed through the first electrode defining layer, through the insulator layer and part way through the III-N material layer and the first electrode is in the first recess;
    a stack on an opposite side of the first electrode defining layer from the insulator layer, wherein the stack comprises an etch stop layer and a second electrode defining layer; and
    a second electrode, wherein a second recess is formed in the second electrode defining layer and in the etch stop layer, and the second electrode is in the second recess.

17. The device of claim 16, wherein a first portion of the III-N material layer has a first composition and a second portion of the III-N material layer has a second composition, wherein a difference between the first composition and the second composition causes a 2DEG channel to be formed in the III-N material layer.

18. The device of claim 16, wherein the insulator layer is less than 100 nanometers.

19. The device of claim 17, wherein the recess extends all the way through the first portion of the III-N material layer and into the second portion of the III-N material layer.

20. The device of claim 16, further comprising a second insulator layer between the first electrode defining layer and the etch stop layer.

21. The device of claim 16, wherein the second electrode is electrically connected to the first electrode.

22. The device of claim 16, wherein the first electrode comprises a gate, and the device further comprises a source and a drain.

23. The device of claim 22, wherein a positive voltage must be applied to the gate to induce a 2DEG in the gate region of the III-N material layer.

24. The device of claim 23, wherein the device is an enhancement-mode device.

25. The device of claim 16, wherein either the first electrode or the second electrode or both includes a field plate.

26. The device of claim 25, wherein the field plate is a slant field plate.

27. The device of claim 26, wherein the first electrode defining layer and the insulator layer are formed of different materials.

28. The device of claim 27, wherein the electrode defining layers comprise SiN.

* * * * *